(12) United States Patent
Kumano

(10) Patent No.: US 9,806,189 B2
(45) Date of Patent: Oct. 31, 2017

(54) SEMICONDUCTOR DEVICE

(71) Applicant: ROHM CO., LTD., Kyoto (JP)

(72) Inventor: Hiroshi Kumano, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 15/208,936

(22) Filed: Jul. 13, 2016

(65) Prior Publication Data

US 2017/0047442 A1 Feb. 16, 2017

(30) Foreign Application Priority Data

Aug. 13, 2015 (JP) ................... 2015-159874

(51) Int. Cl.
*H01L 29/78* (2006.01)
*H01L 29/40* (2006.01)
(Continued)

(52) U.S. Cl.
CPC ........ *H01L 29/7816* (2013.01); *H01L 23/564* (2013.01); *H01L 23/585* (2013.01);
(Continued)

(58) Field of Classification Search
CPC ............. H01L 29/7816; H01L 29/0615; H01L 29/0646; H01L 29/0649; H01L 29/1095
See application file for complete search history.

(56) References Cited

U.S. PATENT DOCUMENTS 5,055,896 A * 10/1991 Williams ............ H01L 29/0615 257/344
5,283,202 A * 2/1994 Pike, Jr. ................ H01L 21/033 257/E21.033
(Continued)

FOREIGN PATENT DOCUMENTS

JP 2001-358153 A 12/2001
JP 2002-353444 A 12/2002
(Continued)

OTHER PUBLICATIONS

N. Fujishima et al., "A 700V Lateral Power MOSFET with Narrow Gap Double Metal Field Plates Realizing Low On-resistance and Long-term Stability of Performance", Proceedings of the 13th International Symposium on 2001 Power Semiconductor Devices and ICs, ISPSD '01, Jun. 4-7, 2001.
(Continued)

*Primary Examiner* — Nathan W Ha
(74) *Attorney, Agent, or Firm* — Rabin & Berdo, P.C.

(57) ABSTRACT

A semiconductor device includes a first conductivity type semiconductor layer, a second conductivity type body region in a semiconductor layer surface portion, a first conductivity type source region in a body region surface, apart from a peripheral edge of the body region, a first conductivity type drain region in the semiconductor layer surface portion apart from the body region, a gate electrode opposing the body region across a gate insulating film between the source and drain regions, an insulating layer on the semiconductor layer, resin on the insulating layer, a source electrode in the insulating layer, electrically connected to the source region, a drain electrode in the insulating layer, electrically connected to the drain region, and conductive shielding in the insulating layer, overlapping in a plan view from a direction normal to a semiconductor layer surface, the drain region and the gate electrode, and covering a region between them.

15 Claims, 15 Drawing Sheets

(51) Int. Cl.
 H01L 23/00 (2006.01)
 H01L 23/58 (2006.01)
 *H01L 29/423* (2006.01)
 *H01L 29/06* (2006.01)

(52) U.S. Cl.
 CPC ........ H01L 29/404 (2013.01); H01L 29/7824 (2013.01); *H01L 29/0692* (2013.01); *H01L 29/42368* (2013.01)

(56) References Cited

U.S. PATENT DOCUMENTS

| | | | | |
|---|---|---|---|---|
| 2001/0048122 | A1* | 12/2001 | Tada | H01L 29/402 257/240 |
| 2002/0145172 | A1 | 10/2002 | Fujishima et al. | |
| 2004/0238854 | A1* | 12/2004 | Krumbein | H01L 29/0634 257/213 |
| 2006/0226451 | A1* | 10/2006 | Davies | H01L 21/76224 257/210 |
| 2008/0203496 | A1* | 8/2008 | Takahashi | H01L 29/7816 257/409 |
| 2010/0140695 | A1* | 6/2010 | Yedinak | H01L 29/7397 257/334 |
| 2011/0210956 | A1* | 9/2011 | Girdhar | H01L 27/088 345/212 |
| 2012/0273878 | A1* | 11/2012 | Mallikar-junaswamy | H01L 29/4175 257/335 |
| 2013/0193502 | A1* | 8/2013 | Kocon | H01L 29/7811 257/302 |
| 2014/0035032 | A1* | 2/2014 | Korec | H01L 21/8234 257/337 |
| 2015/0076593 | A1* | 3/2015 | Darwish | H03K 17/04106 257/332 |
| 2016/0056114 | A1* | 2/2016 | Gao | H01L 23/60 257/340 |

FOREIGN PATENT DOCUMENTS

| | | |
|---|---|---|
| JP | 2003-124459 A | 4/2003 |
| JP | 2006-173204 A | 6/2006 |

OTHER PUBLICATIONS

Gen Tada et al., "PDP Address Driver IC Technology", Fuji Electric Review, vol. 49, No. 3, pp. 89-91, 2003.

* cited by examiner

US 9,806,189 B2

SEMICONDUCTOR DEVICE

CROSS-REFERENCE TO RELATED APPLICATIONS

The present application corresponds to Japanese Patent Application No. 2015-159874 filed in the Japan Patent Office on Aug. 13, 2015, and the entire disclosure of this application is incorporated herein by reference.

TECHNICAL FIELD

The present invention relates to a semiconductor device.

BACKGROUND ART

Patent Document 1 (Japanese Patent Application Publication No. 2002-353444) discloses a semiconductor device including a MOSFET (Metal Oxide Semiconductor Field Effect Transistor). This semiconductor device includes a p-type semiconductor substrate (semiconductor layer). In a surface portion of the semiconductor substrate, a p-type channel region (body region) and an n-type drain-drift region are formed. The channel region is formed inside with an n-type source region, and the drain-drift region is formed inside with an n-type drain region. Between the source region and the drain region, a gate electrode layer opposed to the channel region across a gate insulating film is formed.

On the semiconductor substrate, an interlayer insulating film is formed. On the interlayer insulating film, a molding resin (resin) is formed. In the interlayer insulating film, a source electrode layer that is electrically connected to the source region and a drain electrode layer that is electrically connected to the drain region are formed. To the source electrode layer, a source electrode serving also as a field plate is electrically connected, and to the drain electrode layer, a drain electrode serving also as a field plate is electrically connected.

SUMMARY OF INVENTION

With the arrangement of Patent Document 1, when a predetermined voltage is applied between the drain and source, mobile ions present in the resin are induced by the source electrode and the drain electrode. More specifically, positive ions present in the resin become mobile ions to be induced by the source electrode, and negative ions present in the resin become mobile ions to be induced by the drain electrode.

For example, when there is formed, between an electrode layer formed with a drain electrode or the like and a resin, an oxide film as an insulating film to contact the resin, mobile ions can easily enter into the interlayer insulating film via the oxide film. Additionally, when apart of the oxide film is exposed from an end portion of the semiconductor device, the mobile ions may also enter into the interlayer insulating film by way of the exposed part of the oxide film. On the other hand, when there is formed a nitride film as an insulating film to contact the resin, entry of mobile ions into the interlayer insulating film can be suppressed in no small part by the nitride film. But, when the nitride film is in contact with only a part of the resin or when there is formed an opening or the like in a part of the nitride film, mobile ions in the resin enter into the interlayer insulating film via the part where the nitride film does not exist.

The present inventors have discovered that there is concern that, as a result of mobile ions having entered into the interlayer insulating film or the influence of an electric field due to the mobile ions reaching an underlayer of the source electrode and the drain electrode, an electric field distribution in the semiconductor layer may vary to cause a degradation in the withstand voltage of the semiconductor device. Particularly, with the arrangement of Patent Document 1, the source electrode and the drain electrode are adjacent to each other across a gap in a region between the drain region and the gate electrode. Accordingly, mobile ions or the influence of an electric field due to the mobile ions reaches an underlayer of the source electrode and the drain electrode via the gap. This results in variation in electric field distribution between the drain region and the gate electrode in the semiconductor layer, and the semiconductor device degrades in withstand voltage.

Therefore, it is an object of the present invention to provide a semiconductor device capable of suppressing degradation in withstand voltage caused by mobile ions.

DESCRIPTION OF EMBODIMENTS

Figure 1:
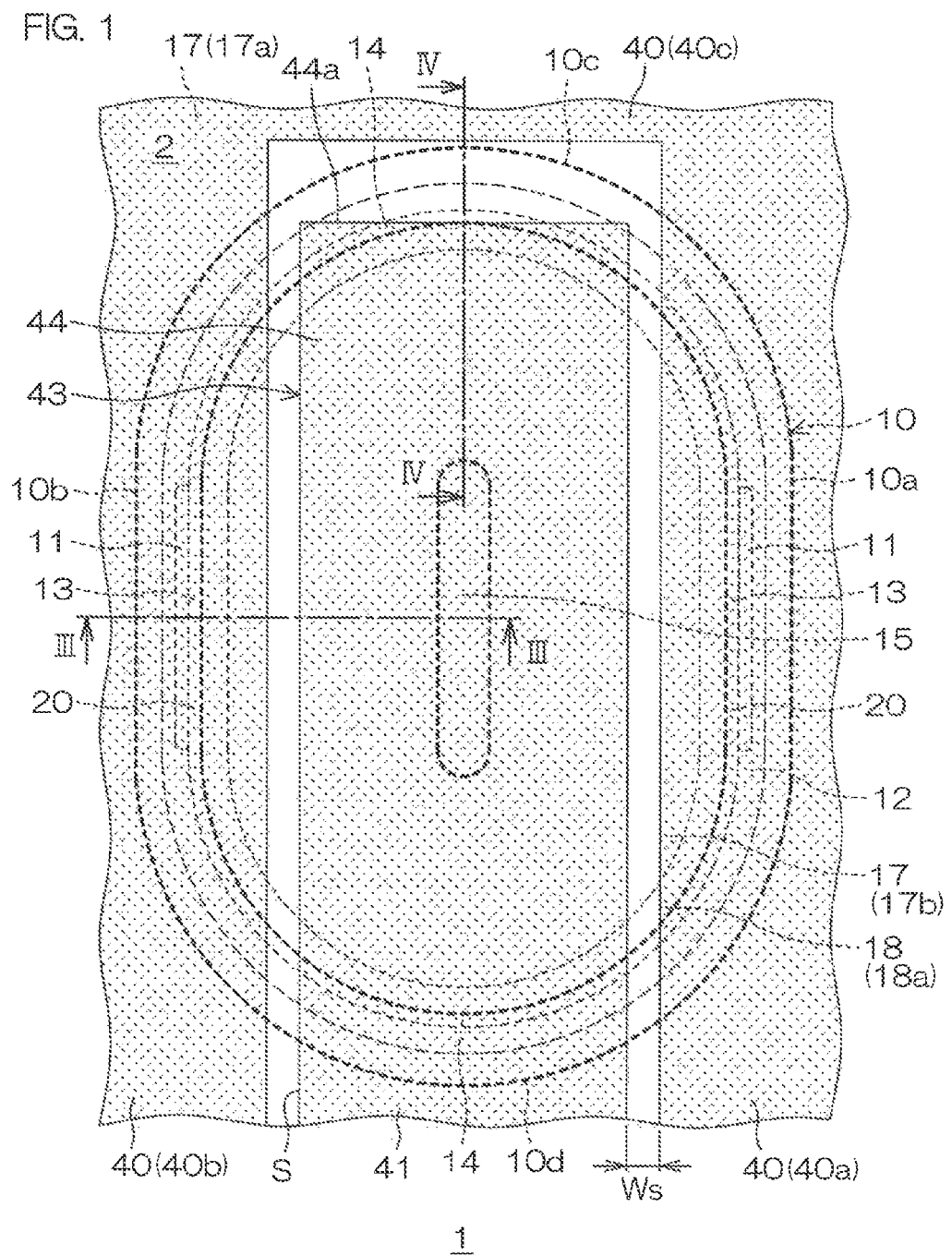
FIG. 1 is a plan view showing a semiconductor device according to a first preferred embodiment of the present invention.

A semiconductor device according to an aspect of the present invention to achieve the above object includes a semiconductor layer of a first conductivity type, a body region of a second conductivity type formed in a surface portion of the semiconductor layer, a source region of a first conductivity type formed in a surface portion of the body region apart from a peripheral edge of the body region, a drain region of a first conductivity type formed in the surface portion of the semiconductor layer apart from the body region, a gate electrode opposed to the body region across a gate insulating film between the source region and the drain region, an insulating layer formed on the semiconductor layer, a resin formed on the insulating layer, a source electrode formed in the insulating layer so as to be electrically connected to the source region, a drain electrode formed in the insulating layer so as to be electrically connected to the drain region, and a conductive shielding member formed in the insulating layer so as to, in a plan view as viewed from a normal direction to a surface of the semiconductor layer, overlap the drain region and the gate electrode at least in part and cover a region between the drain region and the gate electrode.

According to this arrangement, mobile ions leaking out from the resin and the influence of an electric field due to the mobile ions can be shielded, by the shielding member, at least between a region between the drain region and the gate electrode in the semiconductor layer and the resin. Because the variation in electric field distribution caused by mobile ions between the drain region and the gate electrode can thereby be suppressed, a degradation in withstand voltage of the semiconductor device caused by mobile ions can be suppressed.

In the semiconductor device, it is preferable that the shielding member includes a conductive film that is made of an electrode film integrally formed in the same layer as with the drain electrode, and is led out from the drain electrode so as to overlap the gate electrode in the plan view.

According to this arrangement, negative ions in the resin induced by the drain electrode and the influence of an electric field due to the negative ions can be satisfactorily shielded by the conductive film, and positive ions in the resin induced by the source electrode and the influence of an electric field due to the positive ions can be satisfactorily shielded by the source electrode. Because the variation in electric field distribution caused by mobile ions between the drain region and the gate electrode can thereby be satisfactorily suppressed, a degradation in withstand voltage of the semiconductor device caused by mobile ions can be satisfactorily suppressed.

In the semiconductor device, the shielding member may include a first conductive film that is made of an electrode film integrally formed in the same layer as with the drain electrode, and is led out from the drain electrode so as to overlap the gate electrode in the plan view and a second conductive film that is formed between the gate electrode and the first conductive film, and is applied with a voltage lower than that of the drain electrode.

According to this arrangement, negative ions in the resin induced by the drain electrode and the influence of an electric field due to the negative ions can be satisfactorily shielded by the first conductive film, and positive ions in the resin induced by the source electrode and the influence of an electric field due to the positive ions can be satisfactorily shielded by the source electrode and the second conductive film. Because the variation in electric field distribution caused by mobile ions between the drain region and the gate electrode can thereby be satisfactorily suppressed, a degradation in withstand voltage of the semiconductor device caused by mobile ions can be satisfactorily suppressed.

In the semiconductor device, the shielding member may include a first conductive film that is made of an electrode film integrally formed in the same layer as with the drain electrode, is led out from the drain electrode toward the gate electrode, and has an end portion between the drain region and the gate electrode in the plan view and a second conductive film that is formed between the gate electrode and the first conductive film so as to overlap the gate electrode and the first conductive film in the plan view, and is applied with a voltage lower than that of the drain electrode. Because the variation in electric field distribution caused by mobile ions between the drain region and the gate electrode can be satisfactorily suppressed by such an arrangement as well, a degradation in withstand voltage of the semiconductor device caused by mobile ions can be satisfactorily suppressed.

In the semiconductor device, the shielding member may include a first conductive film made of an electrode film that is applied with a voltage higher than that of the source electrode, and formed so as to overlap the gate electrode at least in part in the plan view and a second conductive film made of an electrode film that is applied with a voltage lower than that of the drain electrode, and formed so as to overlap the first conductive film and the gate electrode in the plan view. Because the variation in electric field distribution caused by mobile ions between the drain region and the gate electrode can be satisfactorily suppressed by such an arrangement as well, a degradation in withstand voltage of the semiconductor device caused by mobile ions can be satisfactorily suppressed.

In the semiconductor device, the shielding member may be formed so as to cross the body region in the plan view.

In the semiconductor device, the body region may have a channel forming portion that forms a channel between the semiconductor layer and the source region and a breakdown voltage holding portion in which the source region does not exist. In this case, the shielding member may be formed so as to cover at least a region between the drain region and the breakdown voltage holding portion of the body region in the plan view.

According to this arrangement, a degradation in drain-source withstand voltage, a degradation in breakdown tolerance, or the like due to a radius of curvature of a pattern can be suppressed by the breakdown voltage holding portion in which no source region exists. Moreover, between the drain region and the breakdown voltage holding portion, mobile ions and the influence of an electric field due to the mobile ions can be shielded by the shielding member, so that the variation in electric field distribution caused by mobile ions can be suppressed between the drain region and the breakdown voltage holding portion. As a result, a degradation in withstand voltage, a degradation in breakdown tolerance, or the like caused by a radius of curvature of a pattern can be suppressed, while a degradation in withstand voltage (e.g., a drain-source breakdown voltage) of the semiconductor device caused by mobile ions can be suppressed.

In the semiconductor device, the body region may be formed in a ring shape in the plan view. In the semiconductor device, the body region may be formed in an oval ring shape having a pair of mutually parallel straight parts and a pair of curved parts that are respectively continuous to both ends of the pair of straight parts in the plan view. In this case, the channel forming portion of the body region may be formed along at least one of the straight parts of the body region, and the breakdown voltage holding portion of the body region may be formed along at least one of the curved parts of the body region.

Unlike the straight part of the body region, in the curved part, a predetermined radius of curvature exists, and there is therefore a tendency that an electric field easily concentrates as compared with the straight part. Also, if a source region is formed in the curved part of the body region, there is concern that the part where the source region is formed may greatly degrade in breakdown tolerance.

Therefore, in this arrangement, a channel forming portion in which a source region exists is formed along the straight part of the body region, and a breakdown voltage holding portion in which no source region exists is formed along the curved part of the body region. That is, because the source region is formed away from the curved part that is easily influenced by an electric field, a degradation in the source-drain withstand voltage or breakdown tolerance of the semiconductor device as a result of being influenced by mobile ions or an electric field due to mobile ions. Also, because a relatively wide breakdown voltage holding portion can be formed as well, the breakdown tolerance of the semiconductor device can be satisfactorily secured.

Moreover, in this arrangement, a shielding member is formed so as to, in a plan view, cover at least the region between the drain region and the breakdown voltage holding portion of the body region. Because mobile ions and the influence of an electric field from the mobile ions can thereby be shielded in the curved part where an electric field easily concentrates, the variation in electric field distribution caused by mobile ions between the drain region and the breakdown voltage holding portion can be effectively suppressed. As a result, a degradation in withstand voltage of the semiconductor device can be satisfactorily suppressed.

The semiconductor device may further include a thick insulating film formed integrally with the gate insulating film so as to cover the semiconductor layer between the drain region and the gate insulating film, and having a thickness greater than that of the gate insulating film. In this case, the gate electrode may be formed continuously from on the gate insulating film to on the thick insulating film.

In the semiconductor device, the shielding member may contain one or a plurality of types of metal selected from a group containing aluminum, copper, titanium, tungsten, and tantalum. In the semiconductor device, a distance between the body region and the drain region may be 50 μm or more and 200 μm or less. In the semiconductor device, a drain-source voltage to be applied between the drain electrode and the source electrode may be 400V or more and 1500V or less.

A semiconductor device according to another aspect of the present invention includes a semiconductor layer of a first conductivity type, a body region of a second conductivity type formed in a surface portion of the semiconductor layer, a source region of a first conductivity type formed in a surface portion of the body region apart from a peripheral edge of the body region, a drain region of a first conductivity type formed in the surface portion of the semiconductor layer apart from the body region, a gate electrode opposed to the body region across a gate insulating film between the source region and the drain region, an insulating layer formed on the semiconductor layer, a resin formed on the insulating layer, a source electrode formed in the insulating layer so as to be electrically connected to the source region, a drain electrode formed in the insulating layer so as to be electrically connected to the drain region, and a conductive shielding member formed in the insulating layer so as to, in a plan view as viewed from a normal direction to a surface of the semiconductor layer, overlap the gate electrode at least in part and collectively cover a region between the drain region and the gate electrode. Because the variation in electric field distribution caused by mobile ions between the drain region and the gate electrode can be satisfactorily suppressed by such an arrangement as well, a degradation in withstand voltage of the semiconductor device caused by mobile ions can be suppressed.

A semiconductor device according to still another aspect of the present invention includes a semiconductor layer of a first conductivity type, a source region and a drain region of a first conductivity type formed in a surface portion of the semiconductor layer apart from each other, a body region of a second conductivity type formed in the surface portion of the semiconductor layer so as to enclose the source region, and having a channel forming portion that forms a channel between the semiconductor layer and the source region and a breakdown voltage holding portion in which the source region does not exist, a gate electrode opposed to the body region across a gate insulating film between the source region and the drain region, an insulating layer formed on the semiconductor layer, a resin formed on the insulating layer, and a conductive shielding member formed in the insulating layer so as to, in a plan view as viewed from a normal direction to a surface of the semiconductor layer, cover at least a region between the drain region and the breakdown voltage holding portion of the body region.

According to this arrangement, a degradation in withstand voltage, a degradation in breakdown tolerance, or the like due to a radius of curvature of a pattern can be suppressed by the breakdown voltage holding portion in which no source region exists. Moreover, between the drain region and the breakdown voltage holding portion, mobile ions and the influence of an electric field due to the mobile ions can be shielded by the shielding member, so that the variation in electric field distribution caused by mobile ions can be suppressed between the drain region and the breakdown voltage holding portion. As a result, a degradation in withstand voltage, a degradation in breakdown tolerance, or the like caused by a radius of curvature of a pattern can be suppressed, while a degradation in withstand voltage (e.g., a drain-source breakdown voltage) of the semiconductor device can be suppressed.

Hereinafter, preferred embodiments of the present invention will be described in detail while referring to the accompanying drawings.

Figure 2:
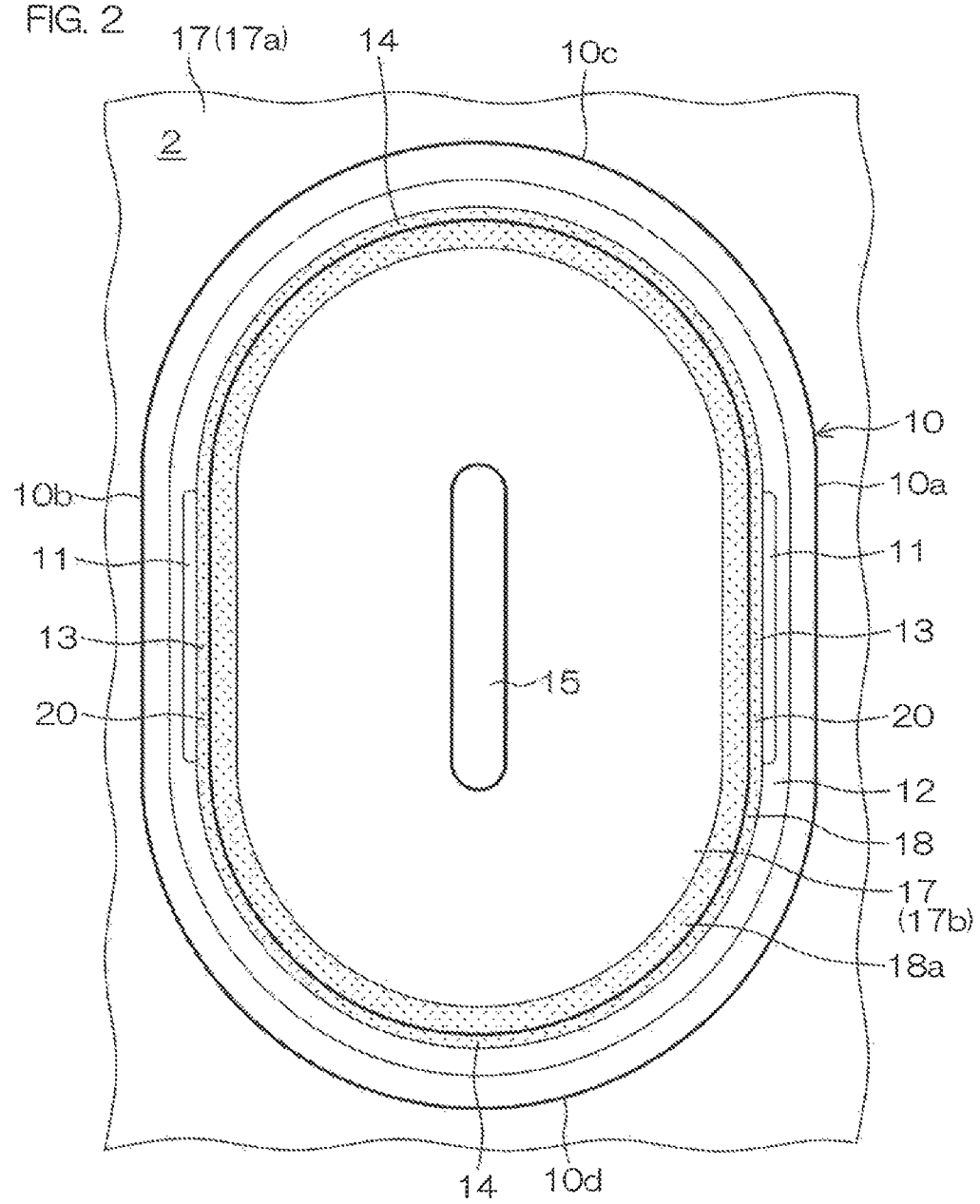
FIG. 2 is a plan view showing the semiconductor device shown in FIG. 1, from which electrodes are removed.
Figure 3:
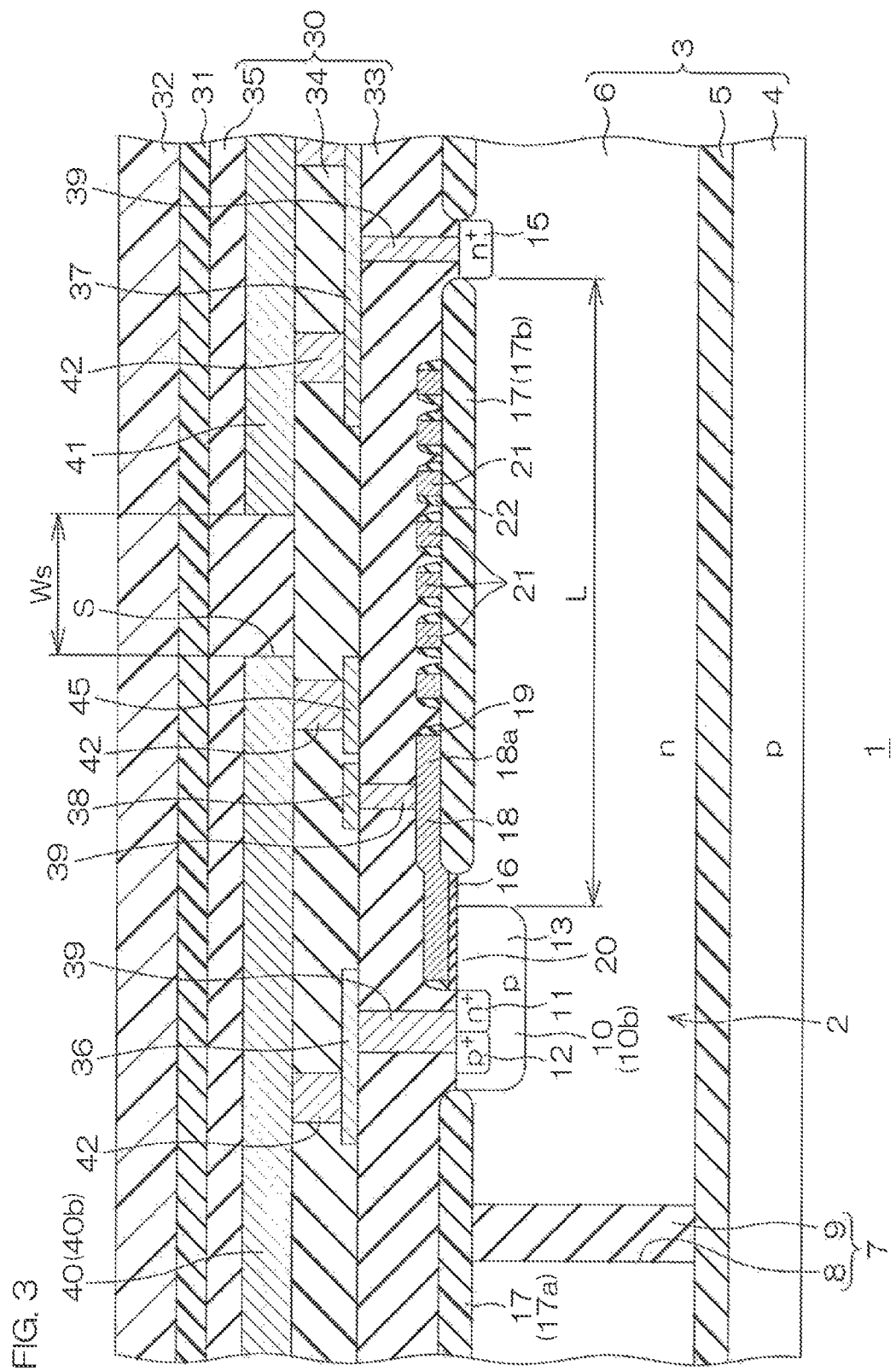
FIG. 3 is a sectional view taken along line III-III shown in FIG. 1.
Figure 4:
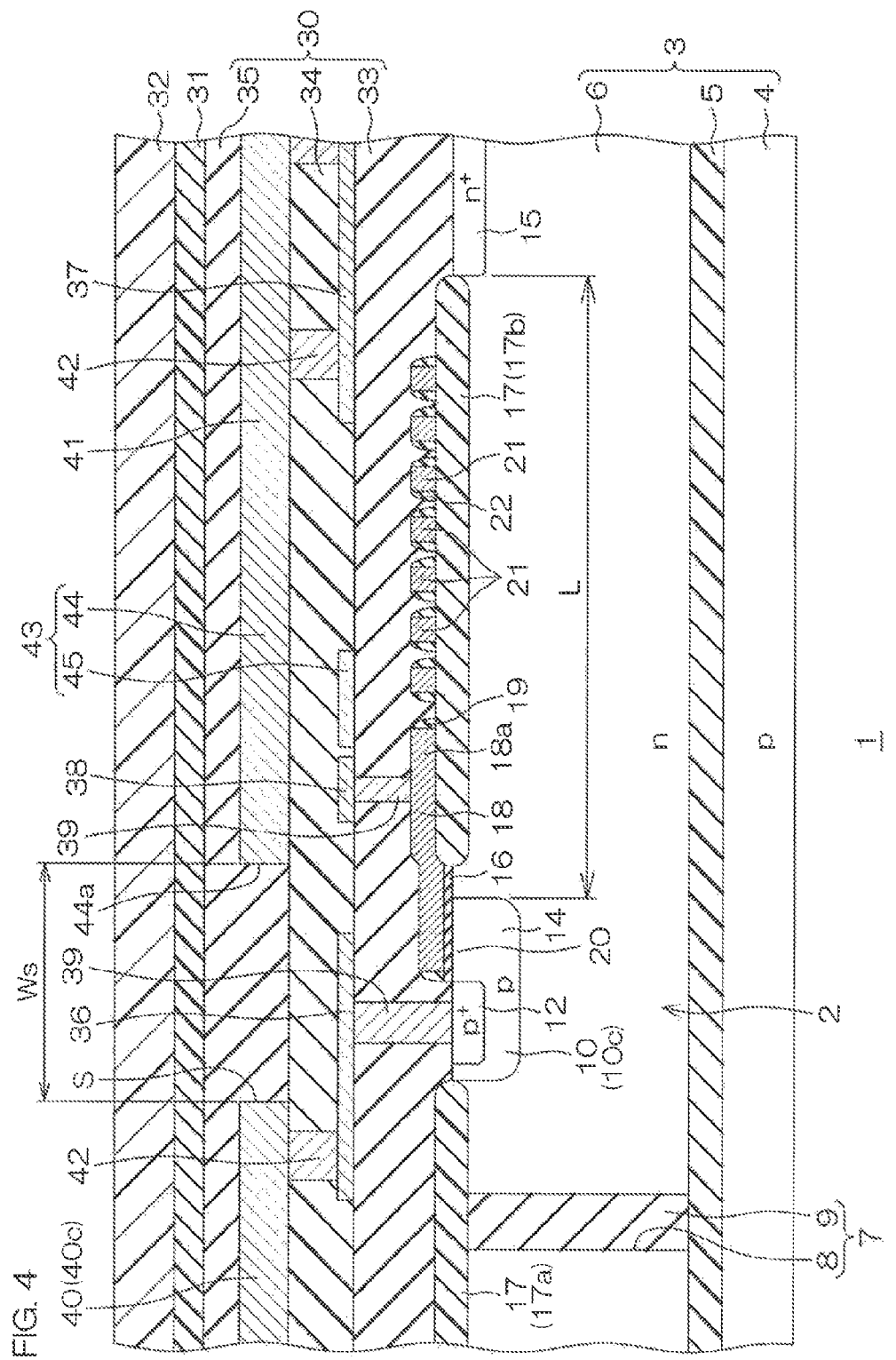
FIG. 4 is a sectional view taken along line IV-IV shown in FIG. 1.

FIG. 1 is a plan view showing a semiconductor device 1 according to a first preferred embodiment of the present invention. FIG. 2 is a plan view showing the semiconductor device 1 shown in FIG. 1, from which a second source electrode 40 and a second drain electrode 41 to be described later are removed. FIG. 3 is a sectional view taken along line shown in FIG. 1. FIG. 4 is a sectional view taken along line IV-IV shown in FIG. 1. In FIG. 1, a second source electrode 40 and a second drain electrode 41 to be described later are shown with hatching for the sake of clarification. Also, in FIG. 2, a gate electrode 18 to be described later is shown with hatching for the sake of clarification.

In the following, when an impurity is referred to as an n-type impurity (n-type), description will be given assuming that a pentad (e.g., phosphorous (P), arsenic (As), or the like) is contained as a main impurity, and when referred to as a p-type impurity (p-type), that a triad (e.g., boron (B), indium (In), gallium (Ga), or the like) is contained as a main impurity.

The semiconductor device 1 is, for example, a semiconductor device including an LDMIS (laterally diffused metal insulator semiconductor) region 2 formed with an LDMIS a drain-source voltage $V_{ds}$ of which is 400V or more and 1500V or less. More specifically, the semiconductor 1 includes an SOI substrate 3. The SOI substrate 3 includes a p-type semiconductor substrate 4, a buried insulating layer 5 formed on the semiconductor substrate 4, and an n-type epitaxial layer 6 as an example of a semiconductor layer of the present invention formed on the buried insulating layer 5.

The semiconductor substrate 4 may be, for example, a silicon substrate. A p-type impurity concentration of the semiconductor substrate 4 may be, for example, $1.0 \times 10^{13}$ $cm^{-3}$ or more and $1.0 \times 10^{14}$ $cm^{-3}$ or less. The buried insulating layer 5 may be, for example, a BOX (Buried Oxide) layer containing silicon oxide formed by surface oxidation of the semiconductor substrate 4. A thickness of the buried insulating layer 5 may be, for example, 3 μm or more and 5 μm or less.

An n-type impurity concentration of the epitaxial layer 6 may be, for example, $10 \times 10^{14}$ $cm^{-3}$ or more and $10 \times 10^{16}$ $cm^{-3}$ or less. A resistance value of the epitaxial layer 6 may be, for example, 10 Ω·cm or more and 20 Ω·cm or less. A thickness of the epitaxial layer 6 may be, for example, 20 μm or more and 40 μm or less. Although, in the present preferred embodiment, description will be given of an example in which the SOI substrate 3 is employed, in place of the SOI substrate 3, a so-called bulk substrate for which an n-type epitaxial layer 6 is formed on a p-type semiconductor substrate 4 in a manner contacting the semiconductor substrate 4 may be employed. In this epitaxial layer 6, a DTI (Deep Trench Isolation) structure 7 serving as an element isolation structure that demarcates the LDMIS region 2 from other regions is formed.

The DTI structure 7 is formed in a substantially ring shape in a plan view as viewed from a normal direction to a surface of the epitaxial layer 6 (hereinafter, simply referred to as a "plan view"). The DTI structure 7 is, in the present preferred embodiment, formed in a substantially oval ring shape in a plan view. The DTI structure 7 includes an insulator 9 buried in a trench 8 formed in the epitaxial layer 6. The trench 8 is formed by digging down the epitaxial layer 6 so as to reach the buried insulating layer 5. The insulator 9 includes, for example, silicon oxide, and is continuous to the buried insulating layer 5 in the trench 8. The LDMIS region 2 is set within a region enclosed by the DTI structure 7. Although, in the present preferred embodiment, a description has been given of an example in which the DTI structure 7 serving as an element isolation structure is formed, the element isolation structure may be a structure using a diffusion isolation method including a ring-shaped p-type diffusion region to demarcate the LDMIS region 2, that is, a p-n junction isolating method.

In a surface portion of the epitaxial layer 6 in the LDMIS region 2, a p-type body region 10 is formed apart from the DTI structure 7. The body region 10 is formed in a substantially ring shape in a plan view, and forms a p-n junction with the epitaxial layer 6. More specifically, the body region 10 is formed in a substantially oval ring shape in a plan view having a pair of mutually parallel band-shaped straight parts 10a and 10b and a pair of band-shaped curved parts 10c and 10d that are respectively continuous to both ends of the pair of band-shaped straight parts 10a and 10b. In a surface portion of the body region 10, an n-type source region 11 and a p-type body contact region 12 are formed adjacent to each other.

The source region 11 is formed in plural numbers apart from a peripheral edge of the body region 10. More specifically, the source region 11 is formed, for each of the pair of straight parts 10a and 10b of the body region 10, in a linear shape along the straight part 10a, 10b. The source region 11 is not formed for the pair of curved parts 10c and 10d of the body region 10. That is, the pair of straight parts 10a and 10b of the body region 10 include a channel forming portion 13 that forms a channel 20 to be described later between the epitaxial layer 6 and the source region 11, and the pair of curved parts 10c and 10d of the body region 10 include a breakdown voltage holding portion 14 in which no source region 11 exists.

The body contact region 12 is formed in a substantially oval ring shape in a plan view along the body region 10. In the pair of straight parts 10a and 10b of the body region 10, the body contact region 12 is formed between an outer peripheral edge of the body region 10 and the source region 11. On the other hand, in the pair of curved parts 10c and 10d of the body region 10, the body contact region 12 is formed between outer and inner peripheral edges of the body region 10. The body contact region 12 has a p-type impurity concentration higher than that of the body region 10.

In a central portion of a region enclosed by the body region 10 in the surface portion of the epitaxial layer 6, an n-type drain region 15 is formed apart from the body region 10. The drain region 15 is, at a middle portion in a direction in which the pair of straight parts 10a and 10b of the body region 10 are opposed, formed in a linear shape along the straight parts 10a and 10b. The drain region 15 has an n-type impurity concentration substantially the same as that of the source region 11. A distance L between the body region 10 and the drain region 15 may be, for example, 50 μm or more and 200 μm or less (in the present preferred embodiment, 60 μm).

Referring to FIG. 3 and FIG. 4, on the surface of the epitaxial layer 6, a gate insulating film 16 and a LOCOS film 17 as an example of a thick insulating film are formed. The gate insulating film 16 is formed in a substantially ring shape so as to contact the body region 10 between the source region 11 and the drain region 15. More specifically, the gate insulating film 16 is formed so as to extend from a peripheral edge closer to the drain region 15 of the source region 11 and a peripheral edge closer to the drain region 15 of the body contact region 12 toward the drain region 15 and cross the inner peripheral edge of the body region 10. The gate insulating film 16 may be a silicon oxide film.

The LOCOS film 17 includes an outer LOCOS film 17a formed along the outer peripheral edge of the body region 10. Further, the LOCOS film 17 includes an inner LOCOS film 17b that covers the epitaxial layer 6 between the body region 10 and the drain region 15. The outer LOCOS film 17a covers the DTI structure 7 outside of the body region 10. On the other hand, the inner LOCOS film 17b is formed in a substantially oval ring shape in a plan view so as to cover the epitaxial layer 6 between the drain region 15 and the gate insulating film 16. An inner peripheral edge of the inner LOCOS film 17b encloses the drain region 15. An outer peripheral edge of the inner LOCOS film 17b is continuous to the gate insulating film 16 at a position away from the inner peripheral edge of the body region 10 toward the drain region 15.

The LOCOS film. 17 has a thickness greater than that of the gate insulating film 16. The thickness of the gate insulating film 16 may be, for example, 300 Å to 1000 Å (in the present preferred embodiment, 600 Å). The thickness of the LOCOS film 17 may be, for example, 4000 Å to 15000 Å (in the present preferred embodiment, 6000 Å).

On the gate insulating film 16, a gate electrode 18 opposed to the body region 10 is formed. The gate electrode 18 is formed in a substantially oval ring shape in a plan view along the outer peripheral edge of the inner LOCOS film 17b. The gate electrode 18 extends continuously from on the gate insulating film 16 to on the inner LOCOS film 17b, and has a covering portion 18a that covers the outer peripheral edge of the inner LOCOS film 17b. The gate electrode 18 may be polysilicon doped with an impurity. Both side surfaces of the gate electrode 18 are covered with, for example, side walls 19 containing an insulating material such as silicon oxide, silicon nitride, or the like. A part, of the body region 10, to which the gate electrode 18 is opposed across the gate insulating film 16 corresponds to the channel 20.

On the inner LOCOS film 17b, a plurality of (in the present preferred embodiment, eight) field plates 21 are formed apart from each other. The plurality of field plates 21 suppress disturbance in the electric field of the epitaxial layer 6. The plurality of field plates 21 are formed in similar ring shapes different in perimeter from each other. More specifically, the field plates 21 are formed apart from each other so that a field plate 21 having a relatively long perimeter encloses a field plate 21 having a relatively short perimeter.

The plurality of field plates 21 are formed of the same material as with the gate electrode 18. Both side surfaces of each field plate 21 are covered with, for example, side walls 22 containing an insulating material such as silicon oxide, silicon nitride, or the like. In addition, the field plate 21 located at an outermost periphery may be formed integrally with the covering portion 18a of the gate electrode 18. Also, it suffices that at least one or more field plates 21 are provided, and more than eight field plates 21 may be provided.

On the epitaxial layer 6, an insulating layer 30, a passivation film 31, and a molding resin 32 containing, for example, an epoxy resin are laminated in this order. The insulating layer 30 includes a plurality of interlayer insulating films. The plurality of insulating films include a first interlayer insulating film 33 formed on the epitaxial layer 6, a second interlayer insulating film 34 formed on the first interlayer insulating film 33, and a third interlayer insulating film 35 formed on the second interlayer insulating film 34.

The first interlayer insulating film 33, the second interlayer insulating film 34, and the third interlayer insulating film 35 are formed of, for example, an insulator such as silicon oxide or silicon nitride. The passivation film 31 includes, for example, at least either of silicon nitride and silicon oxide. The passivation film 31 may be a laminated film including a silicon oxide film and a silicon nitride film formed on the silicon oxide film. A thickness of the passivation film 31 may be, for example, 1 µm or more and 10 µm or less. In addition, a resin film made of a polyimide resin may be formed on the passivation film 31. In this case, a thickness of the passivation film 31 including the resin film may be more than 10 µm.

Referring to FIG. 3 and FIG. 4, on the first interlayer insulating film 33, a first source electrode 36, a first drain electrode 37, and a first gate electrode 38 are formed as a first metal. The first source electrode 36, the first drain electrode 37, and the first gate electrode 38 may be, for example, an electrode film containing one or a plurality of types of metal selected from a group containing aluminum, copper, titanium, tungsten, and tantalum.

The first source electrode 36 is electrically connected to the source region 11 and the body contact region 12 via a corresponding contact 39. The first source electrode 36 is provided linearly so as to cover at least a part or the whole of the source region 11. The first drain electrode 37 is electrically connected to the drain region 15 via a corresponding contact 39. The first drain electrode 37 is provided linearly so as to cover at least a part or the whole of the drain region 15. The first gate electrode 38 is electrically connected to the gate electrode 18 via a corresponding contact 39. The first gate electrode 38 is provided in a ring shape along the gate electrode 18 so as to cover at least a part or the whole of the gate electrode 18.

Referring to FIG. 3 and FIG. 4, on the second interlayer insulating film 34, a second source electrode 40 and a second drain electrode 41 are formed as a second metal. The second source electrode 40 and the second drain electrode 41 may be, for example, an electrode film containing one or a plurality of types of metal selected from a group containing aluminum, copper, titanium, tungsten, and tantalum.

Referring to FIG. 1, FIG. 3, and FIG. 4, the second source electrode 40 is electrically connected to the first source electrode 36 via a corresponding contact 42, and provides a predetermined source voltage to the first source electrode 36. The second source electrode 40 may provide a predetermined reference potential, for example, a ground potential to the first source electrode 36. The source electrode 40 is formed in a substantially recessed shape in a plan view so as to expose at least a region over the drain region 15 of the second interlayer insulating film 34. More specifically, the second source electrode 40 includes first and second parts 40a and 40b formed along the pair of straight parts 10a and 10b (channel forming portions 13) of the body region 10 and a connecting portion 40c that connects the first and second parts 40a and 40b.

The first and second parts 40a and 40b of the second source electrode 40 are formed linearly so as to cross the pair of curved parts 10c and 10d of the body region 10. The connecting portion 40c of the second source electrode 40 is connected, in a region closer to the curved part 10c being at one side of the body region 10, to the first and second parts 40a and 40b. The connecting portion 40c of the second source electrode 40 is disposed in a region outside further than the outer periphery of the body region 10.

The second drain electrode 41 is electrically connected to the first drain electrode 37 via a corresponding contact 42, and provides a predetermined drain voltage to the first drain electrode 37. The second drain electrode 41 may provide to the first drain electrode 37 a drain voltage higher than the source voltage that is applied to the second source electrode 40. The second drain electrode 41 is formed in a substantially projecting shape in a plan view so as to be engaged with the part in a substantially recessed shape in a plan view that is demarcated by the second source electrode 40. More specifically, the second drain electrode 41 is formed linearly so as to cross the curved part 10d being at the other side of the body region 10 from an outside of the LDMIS region 2 in a plan view and cover the drain region 15.

The second source electrode 40 and the second drain electrode 41 are adjacent to each other across a slit S with which the same are edged. A width $W_S$ of this slit S may be, for example, 2 µm or more and 50 µm or less.

Referring to FIG. 1, FIG. 3, and FIG. 4, in the insulating layer 30, a shielding member 43 that shields mobile ions leaking out from the molding resin 32 is provided between the epitaxial layer 6 and the molding region 32. More specifically, in the insulating layer 30, a conductive shielding member 43 that, in a plan view, overlaps the drain region 15 and the gate electrode 18 at least in part and collectively covers a region between the drain region 15 and the gate electrode 18. The shielding member 43 is formed so as to, in a plan view, cover at least a region between the drain region 15 and the breakdown voltage holding portion 14 of the body region 10. The shielding member 43 includes a conductive film containing one or a plurality of types of metal selected from a group containing aluminum, copper, titanium, tungsten, and tantalum.

The shielding member 43 includes a first conductive film 44. The first conductive film 44 is made of an electrode film formed in the same layer as with the second drain electrode (that is, on the second interlayer insulating film 34) integrally with the second drain electrode 41, and is formed as a lead-out portion of the second drain electrode 41. The first conductive film 44 is led out in a band shape from the second drain electrode 41 toward the breakdown voltage holding portion 14 of the body region 10 so as to cover the region between the drain region 15 and the breakdown voltage holding portion 14 of the body region 10. The first conductive layer 44 is led out from the second drain electrode 41 so as to overlap at least the covering portion 18a of the gate electrode 18 in a plan view.

That is, the first conductive film 44, in a plan view, covers the plurality of field plates 21 formed in the region between the drain region 15 and the breakdown voltage holding portion 14 of the body region 10. An end portion 44a of the first conductive film 44 is formed perpendicular to the lead-out direction. The first conductive film 44, with a drain-source voltage $V_{ds}$ applied, shields negative ions (mobile ions of a negative polarity) in the molding resin 32 induced by the second drain electrode 41 and the influence of an electric field due to the negative ions.

Also, the shielding member 43 includes a second conductive film 45. The second conductive film 45 is formed between the gate electrode 18 and the first conductive film 44, and is applied with a voltage lower than that of the second drain electrode 41. The second conductive film 45 is formed in a ring shape in an underlayer of the first conductive film 44 (that is, on the first interlayer insulating film 33) so as to cover an end portion closer to the drain region 15 of the gate electrode 18 in a plan view, that is, the covering portion 18a. The second conductive film 45 is electrically connected to the second source electrode 40 via a corresponding contact 42 on the side of the pair of straight parts 10a and 10b of the body region 10. That is, to the second conductive film 45, a source voltage (e.g., a ground voltage) is provided from the second source electrode 40.

The second conductive film 45, with a drain-source voltage $V_{ds}$ applied, shields positive ions (mobile ions of a positive polarity) in the molding resin 32 induced by the second source electrode 40 and the influence of an electric field due to the positive ions. The second conductive film 45 serves also as a field plate that suppresses an electric field from concentrating to the end portion closer to the drain region 15 of the gate electrode 18, that is, the covering portion 18a of the gate electrode 18. In addition, a plurality of second conductive films 45 may be provided in a ring-shaped region along an inner periphery of the first gate electrode 38 in a plan view.

Figure 5:
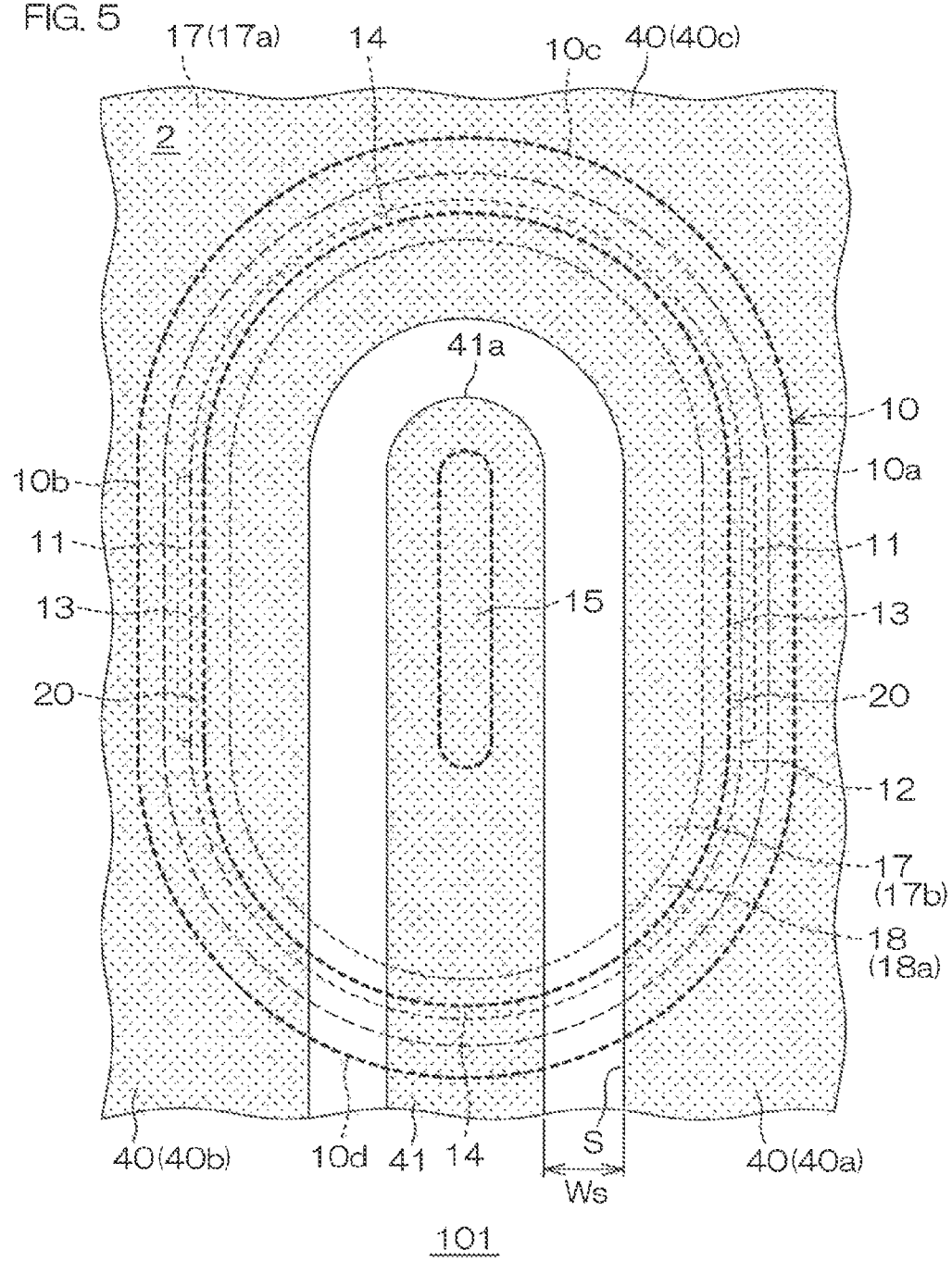
FIG. 5 is a plan view showing a semiconductor device according to a reference example.
Figure 6:
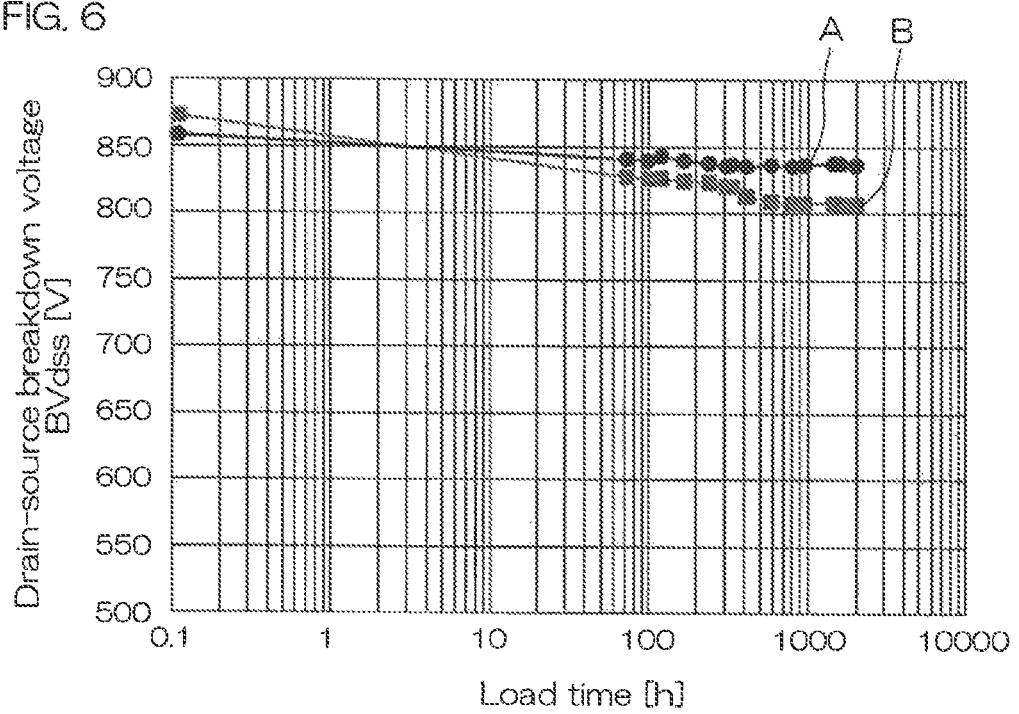
FIG. 6 is a graph showing a drain-source breakdown voltage.

FIG. 5 is a plan view showing a semiconductor device 101 according to a reference example. The semiconductor device 101 according to the reference example is different from the semiconductor device 1 according to the present preferred embodiment in the point of including no shielding member 43 and the point that an end portion 41a of the second drain electrode 41 shows a chamfered circular shape in a plan view. Because other points are substantially the same as those of the semiconductor device 1 according to the present preferred embodiment, description thereof will be omitted. Results of measurement of a withstand voltage of the semiconductor device 1 according to the present preferred embodiment and a withstand voltage of the semiconductor device 101 according to the reference example are shown in FIG. 6. The "withstand voltage of the semiconductor device" mentioned here means, more specifically, a drain-source breakdown voltage $BV_{dss}$. The same applies to the following.

FIG. 6 is a graph showing the drain-source breakdown voltage $BV_{dss}$. In FIG. 6, the horizontal axis represents load time, and the vertical axis represents drain-source breakdown voltage $BV_{dss}$. Measurement conditions of the drain-source breakdown voltage $BV_{dss}$ are as follows.

(1) Temperature: 150° C.
(2) Drain-source voltage $V_{ds}$: 620V
(3) Load time: 2000 hours In the present measurement, respective drain-source breakdown voltages $BV_{dss}$ of the semiconductor devices 1 and 101 were checked after every predetermined time elapsed. Polygonal line A shows a measurement result of the drain-source breakdown voltage $BV_{dss}$ of the semiconductor device 1 according to the present preferred embodiment. Polygonal line B shows a measurement result of the drain-source breakdown voltage $BV_{dss}$ of the semiconductor device 101 according to the reference example. Referring to polygonal line A, in the semiconductor device 1 according to the present preferred embodiment, the drain-source breakdown voltage $BV_{dss}$ had an initial value on the order of 860V, and the drain-source breakdown voltage $BV_{dss}$ had a value on the order of 840V after an elapse of 2000 hours, with its fluctuation rate of approximately 2.3%. On the other hand, referring to polygonal line B, in the semiconductor device 101 according to the reference example, the drain-source breakdown voltage $BV_{dss}$ had an initial value on the order of 870V, and the drain-source breakdown voltage $BV_{dss}$ had a value on the order of 810V after an elapse of 2000 hours, with its fluctuation rate of approximately 6.9%.

The semiconductor device 1 according to the present preferred embodiment and the semiconductor device 101 according to the reference example both showed a temporal degradation in drain-source breakdown voltage $BV_{dss}$, but it could be understood that the fluctuation rate of the drain-source breakdown voltage $BV_{dss}$ has been improved in the semiconductor device 1 according to the present preferred embodiment. That is, it could be understood that the semiconductor device 1 according to the present preferred embodiment can maintain initial characteristics of the drain-source breakdown voltage $BV_{dss}$ over a long period of time, which has thus lengthened the life in terms of the characteristics of the drain-source breakdown voltage $BV_{dss}$.

As above, in the present preferred embodiment, there is formed a shielding member 43 which, in a plan view, overlaps the drain region 15 and the gate electrode 18 at least in part and covers the region between the drain region 15 and the gate electrode 18. By the shielding member 43, mobile ions and the influence of an electric field due to the mobile ions can be shielded between the region between the drain region 15 and the gate electrode 18 in the epitaxial layer 6 and the molding resin 32.

More specifically, in the present preferred embodiment, negative ions in the molding resin 32 induced by the second drain electrode 41 and the influence of an electric field due to the negative ions can be satisfactorily shielded by the first conductive film 44. Moreover, positive ions in the molding resin 32 induced by the second source electrode 40 and the influence of an electric field due to the positive ions can be satisfactorily shielded by the second source electrode 40 and the second conductive film 45. As a result, because the variation in electric field distribution caused by mobile ions between the drain region 15 and the gate electrode 18 can be suppressed, a degradation in withstand voltage of the semiconductor device 1 caused by mobile ions can be suppressed.

Unlike the straight part 10*a*, 10*b* of the body region 10, in the curved part 10*c*, 10*d*, a predetermined radius of curvature exists, and there is therefore a tendency that an electric field easily concentrates as compared with the straight part 10*a*, 10*b*. Also, if a source region 11 is formed in the curved part 10*c*, 10*d* of the body region 10, there is concern that the part where the source region 11 is formed may greatly degrade in breakdown tolerance.

Therefore, in the present preferred embodiment, a channel forming portion 13 in which a source region 11 exists is formed along the straight part 10*a*, 10*b* of the body region 10, and a breakdown voltage holding portion 14 in which no source region 11 exists is formed along the curved part 10*c*, 10*d* of the body region 10. That is, because the source region 11 is formed away from the curved part 10*c*, 10*d* that is easily influenced by an electric field, a degradation in the drain-source withstand voltage or breakdown tolerance of the semiconductor device 1 as a result of being influenced by an mobile ions or an electric field due to mobile ions. Also, because a relatively wide breakdown voltage holding portion 14 can be formed as well, the breakdown tolerance of the semiconductor device 1 can be satisfactorily secured.

Moreover, in the present preferred embodiment, a shielding member 43 is formed so as to, in a plan view, cover at least the region between the drain region 15 and the breakdown voltage holding portion 14 of the body region 10. Because mobile ions and the influence of an electric field due to the mobile ions can thereby be shielded in the curved part 10*c*, 10*d* where an electric field easily concentrates, the variation in electric field distribution caused by mobile ions between the drain region 15 and the breakdown voltage holding portion 14 can be effectively suppressed. As a result, a degradation in withstand voltage of the semiconductor device 1 can be satisfactorily suppressed.

Figure 7:
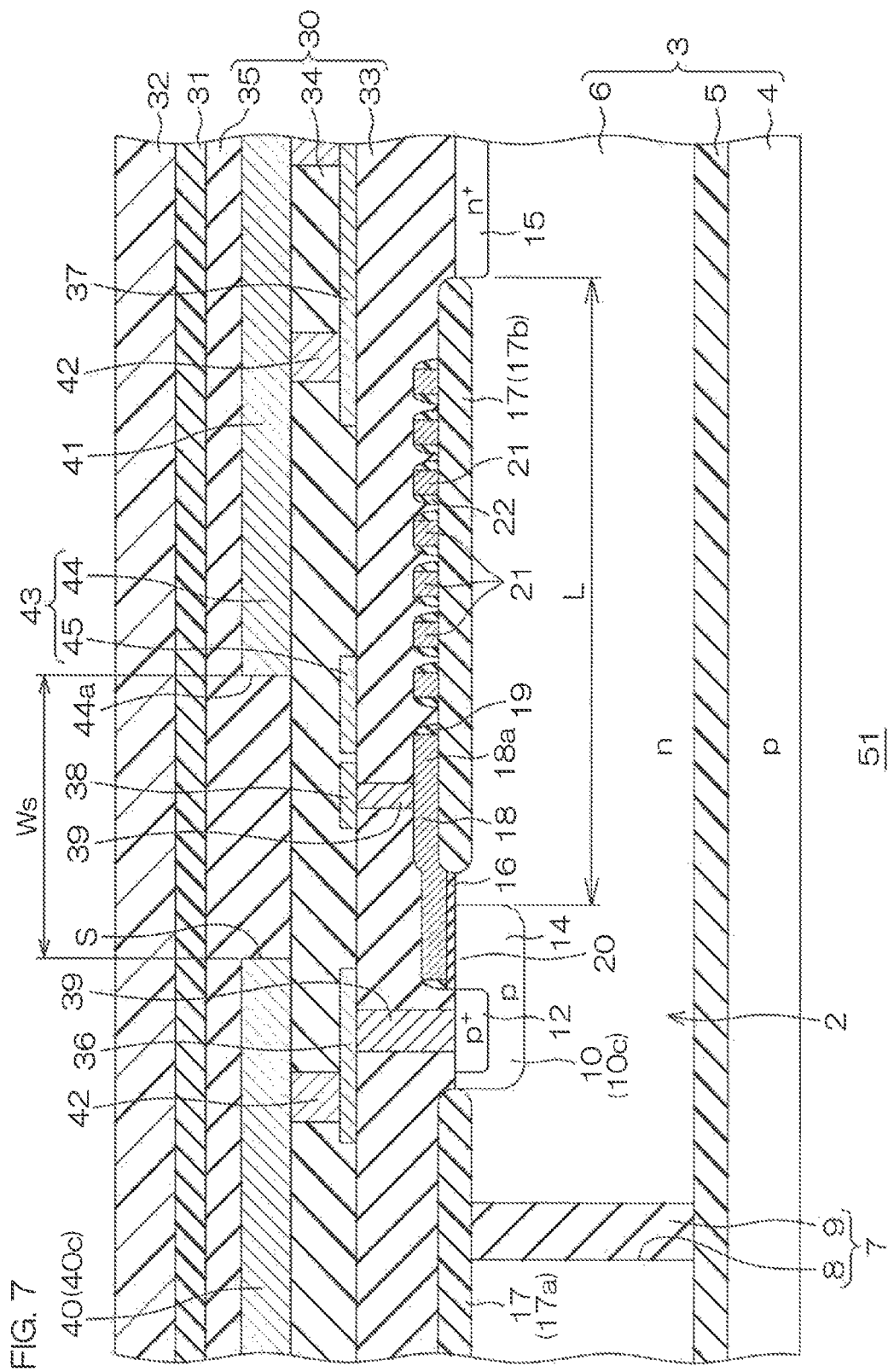
FIG. 7 is a sectional view showing a semiconductor device according to a second preferred embodiment of the present invention.

FIG. 7 is a sectional view showing a semiconductor device 51 according to a second preferred embodiment of the present invention. FIG. 7 is a sectional view corresponding to FIG. 4 in the description above. In FIG. 7, parts corresponding to the respective portions shown in FIG. 4 etc., are denoted by the same reference symbols, and description thereof will be omitted.

As shown in FIG. 7, the end portion 44*a* of the first conductive film 44 in the shielding member 43 is located in the region between the drain region 15 and the gate electrode 18 in a plan view. On the other hand, the second conductive film 45 of the shielding member 43 is formed so as to overlap the gate electrode 18 and the first conductive film 44 in a plan view. More specifically, the second conductive film 45 is formed on the first interlayer insulating film 33 so as to overlap at least the covering portion 18*a* of the gate electrode 18 and overlap the end portion 44*a* of the first conductive layer 44 in a plan view. The same effects as the effects described above for the preferred embodiment can be exhibited by such an arrangement as well.

Figure 8:
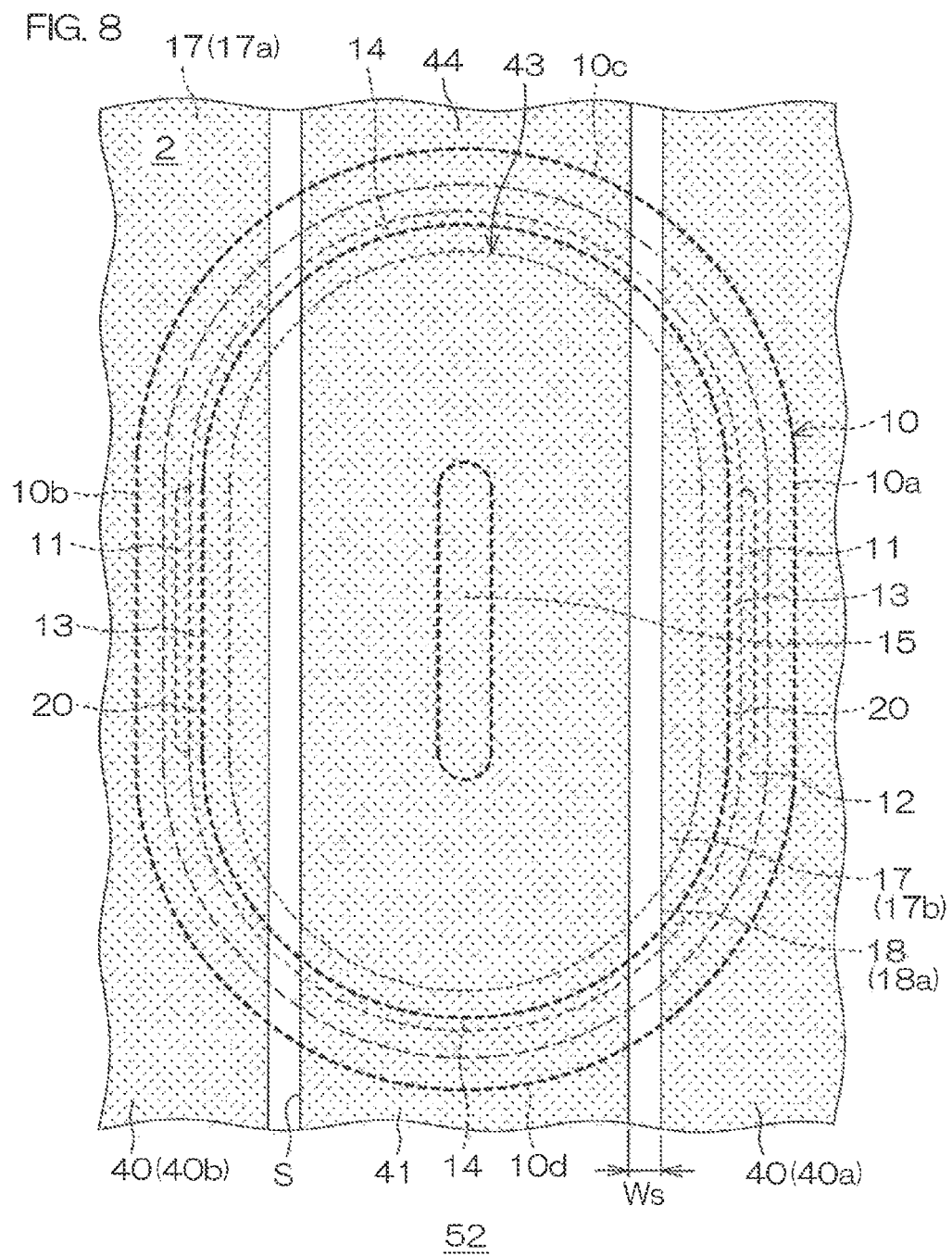
FIG. 8 is a plan view showing a semiconductor device according to a third preferred embodiment of the present invention.

FIG. 8 is a plan view showing a semiconductor device 52 according to a third preferred embodiment of the present invention. FIG. 8 is a plan view corresponding to FIG. 1 in the description above. In FIG. 8, parts corresponding to the respective portions shown in FIG. 1 etc., are denoted by the same reference symbols, and description thereof will be omitted.

In the semiconductor device 52, the first conductive film 44 of the shielding member 43 is led out so as to cross the curved part 10*c* being at one side of the body region 10, that is, the breakdown voltage holding portion 14. On the other hand, the second source electrode 40 includes first and second parts 40*a* and 40*b*, but does not include the connecting portion 40*c* (refer to FIG. 1) described above. The same effects as the effects described above for the preferred embodiment can be exhibited by such an arrangement as well.

Figure 9:
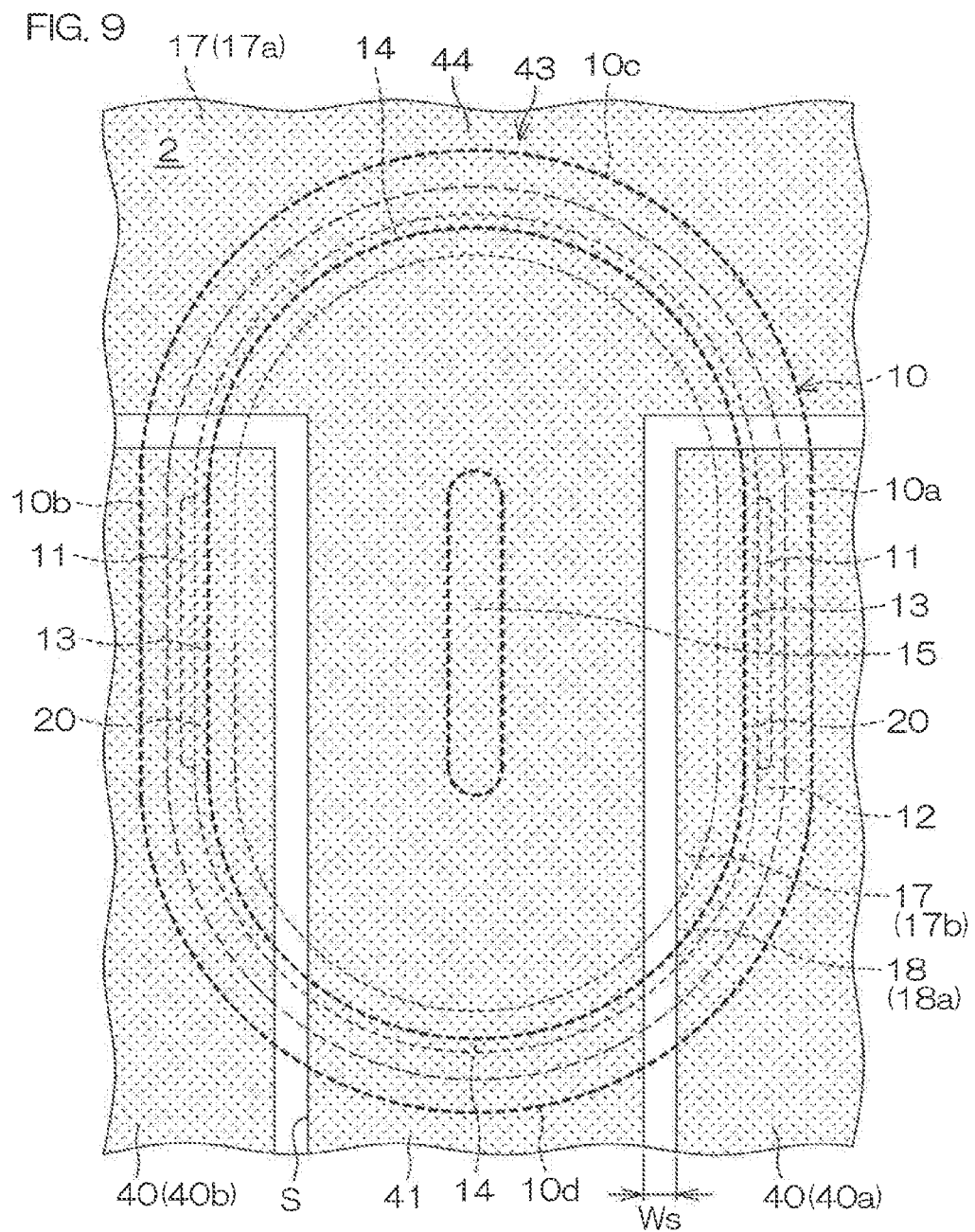
FIG. 9 is a plan view showing a semiconductor device according to a fourth preferred embodiment of the present invention.

FIG. 9 is a plan view showing a semiconductor device 53 according to a fourth preferred embodiment of the present invention. FIG. 9 is a plan view corresponding to FIG. 1 in the description above. In FIG. 9, parts corresponding to the respective portions shown in FIG. 1 etc., are denoted by the same reference symbols, and description thereof will be omitted.

In the semiconductor device 53, the first conductive film 44 of the shielding member 43 is formed so as to cover substantially the entirety of a region between the drain region 15 and the curved part 10*c* being at one side of the body region 10 (breakdown voltage holding portion 14) in a plan view. More specifically, the first conductive film 44 is led out from the second drain electrode 41 so as to cover an arc-shaped region demarcated by the curved part 10*c* being at one side of the body region 10 (breakdown voltage holding portion 14). The first conductive film 44 is led out from the second drain electrode 41 in a direction perpendicular to the direction in which the second drain electrode 41 extends.

On the other hand, the second source electrode 40 includes first and second parts 40*a* and 40*b*, but does not include the connecting portion 40*c* (refer to FIG. 1) described above. The first and second parts 40*a* and 40*b* of the second source electrode 40 cross only the curved part 10*d* being at the other side of the body region 10, and on a side closer to the curved part 10*c* being at one side of the body region 10, has an end portion that is opposed to the first conductive film 44 across slits S. The same effects as the effects described above for the preferred embodiment can be exhibited by such an arrangement as well.

Figure 10:
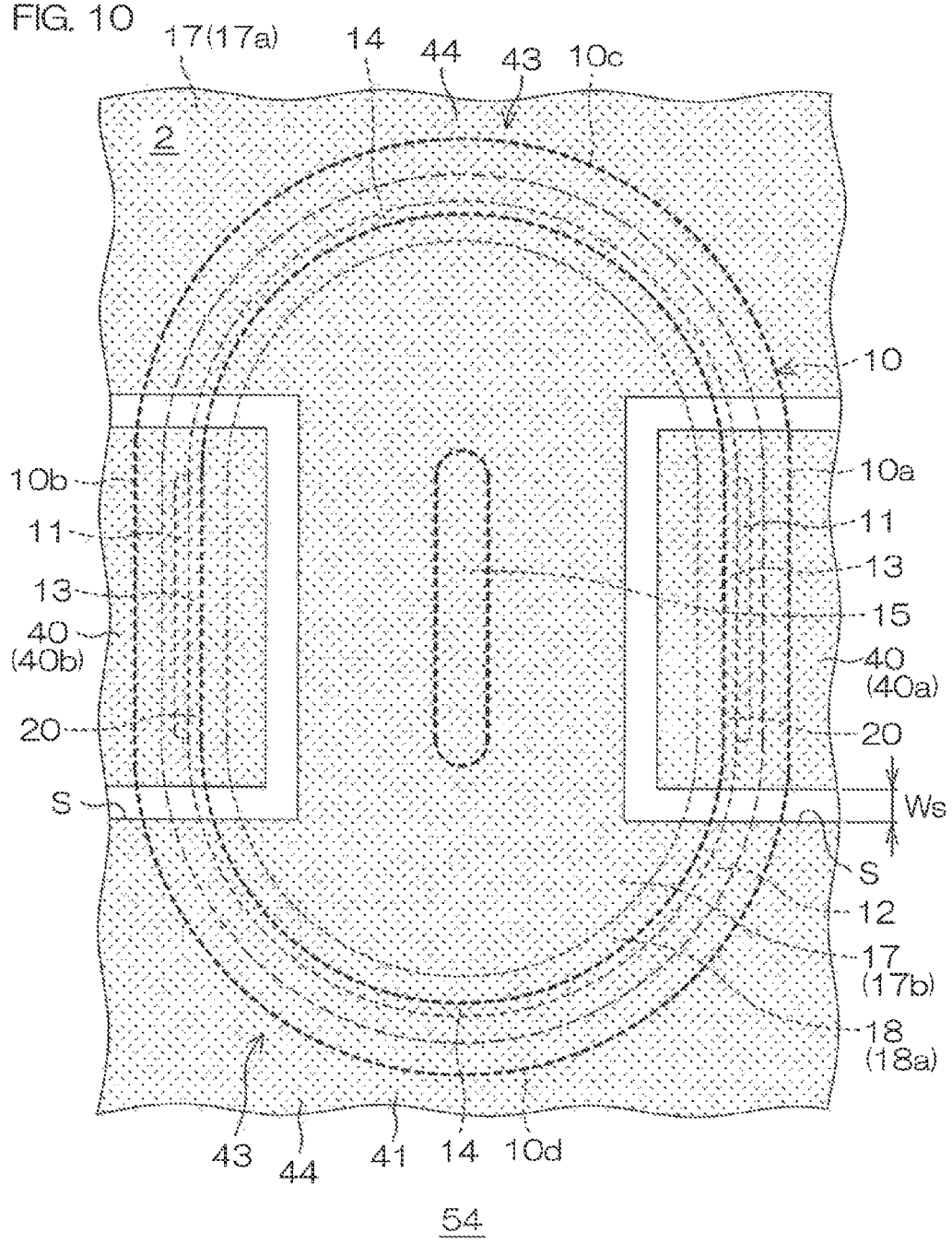
FIG. 10 is a plan view showing a semiconductor device according to a fifth preferred embodiment of the present invention.

FIG. 10 is a plan view showing a semiconductor device 54 according to a fifth preferred embodiment of the present invention. FIG. 10 is a plan view corresponding to FIG. 1 in the description above. In FIG. 10, parts corresponding to the respective portions shown in FIG. 1 etc., are denoted by the same reference symbols, and description thereof will be omitted.

In the semiconductor device 54, the second source electrode 40 includes first and second parts 40*a* and 40*b*, but does not include the connecting portion 40*c* (refer to FIG. 1) described above. The first part 40*a* of the second source electrode 40 is formed so as to cross the straight part 10*a* being at one side of the body region 10 from an outside of the LDMIS region 2. The second part 40*b* of the second source electrode 40 is formed so as to cross the straight part 10*b* being at the other side of the body region 10 from an outside of the LDMIS region 2.

The electrode film including the second drain electrode 41 and the first conductive film 44 is formed so as to, in the LDMIS region 2, cover substantially the entirety of a region other than the first and second parts 40*a* and 40*b* of the second source electrode 40 across slits S. More specifically, the first conductive film 44 is formed so as to cover substantially the entirety of a region between the drain region 15 and the curved part 10*c* being at one side of the body region 10 and a region between the drain region 15 and the curved part 10*d* being at the other side of the body region 10 in a plan view.

That is, the first conductive film 44 is led out from the second drain electrode 41 so as to respectively cover arc-shaped regions demarcated by the curved parts 10*c* and 10*d* being at one and the other sides of the body region 10 (breakdown voltage holding portions 14). The first conductive film 44 is led out from the second drain electrode 41 in a direction perpendicular to the direction in which the second drain electrode 41 extends. The same effects as the effects described above for the preferred embodiment can be exhibited by such an arrangement as well.

Figure 11:
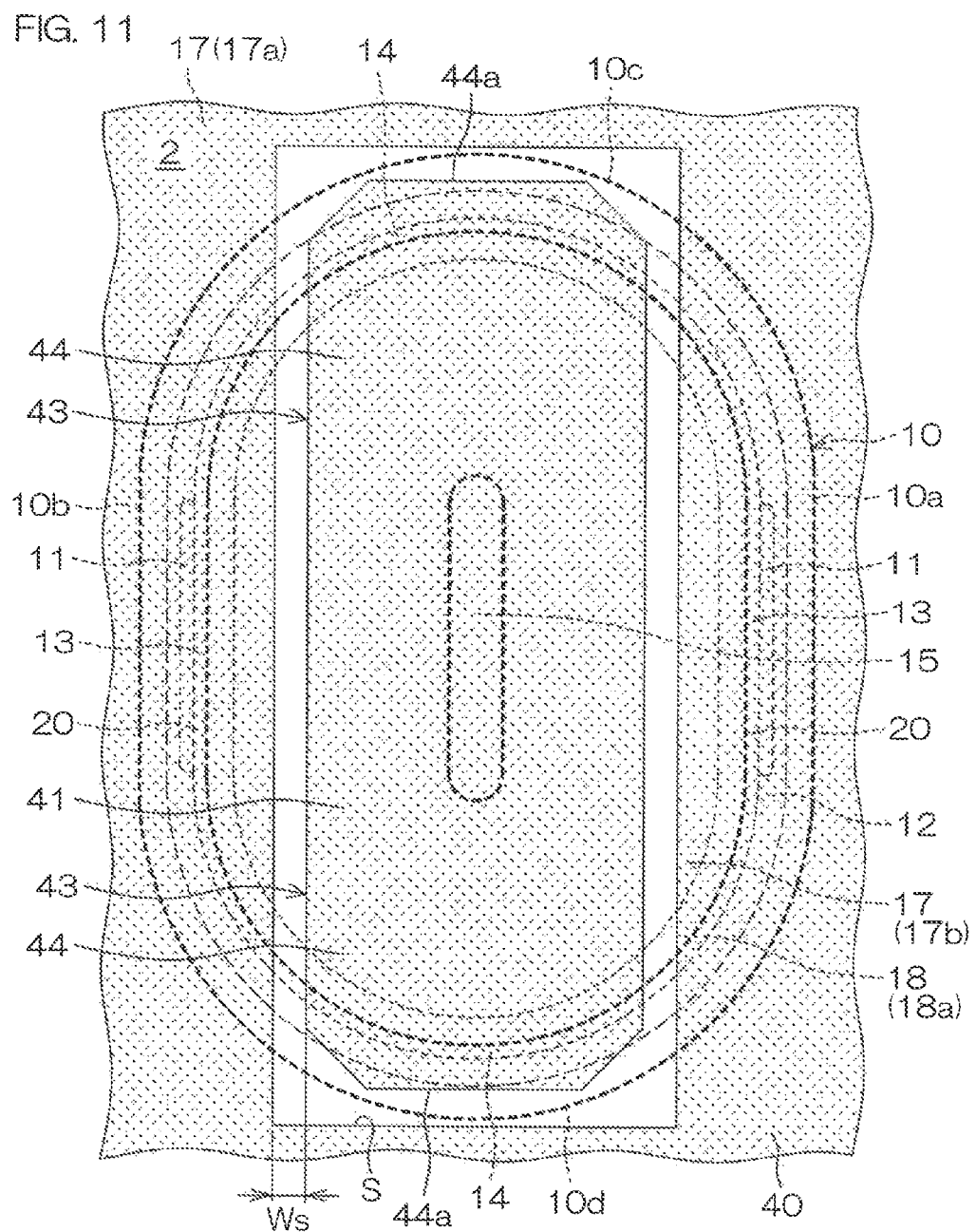
FIG. 11 is a plan view showing a semiconductor device according to a sixth preferred embodiment of the present invention.

FIG. 11 is a plan view showing a semiconductor device 55 according to a sixth preferred embodiment of the present invention. FIG. 11 is a plan view corresponding to FIG. 1 in the description above. In FIG. 11, parts corresponding to the respective portions shown in FIG. 1 etc., are denoted by the same reference symbols, and description thereof will be omitted.

The semiconductor device 55 includes an electrode film including the second drain electrode 41 and the first conductive film 44 (shielding member 43) formed in an island shape in a plan view and a second source electrode 40 formed so as to enclose the second drain electrode 41. The electrode film including the second drain electrode 41 and the first conductive film 44 is in a substantially rectangular shape in a plan view (quadrangular shape), and is formed so as to cover the drain region 15. Regarding the electrode film, examples of the substantially rectangular shape in a plan view (quadrangular shape) include a shape corner portions of which are trimmed. That is, as shown in FIG. 11, the electrode film including the second drain electrode 41 and the first conductive film 44 may be in a substantially rectangular shape in a plan view (quadrangular shape) corner portions of which are trimmed in linear shapes in a plan view. Alternatively, the electrode film including the second drain electrode 41 and the first conductive film 44 may be in a substantially rectangular shape in a plan view (quadrangular shape) corner portions of which are trimmed in outward arc shapes in a plan view.

The electrode film including the second drain electrode 41 and the first conductive film 44 is, for example, via a wiring member such as a wire, electrically connected to a drain terminal or the like provided in a region other than the second source electrode 40. In the present preferred embodiment, the first conductive film 44 is formed so as to respectively cover regions between the drain region 15 and the curved parts 10*c* and 10*d* being at one and the other sides of the body region 10 (breakdown voltage holding portions 14) in a plan view. The same effects as the effects described above for the preferred embodiment can be exhibited by such an arrangement as well.

Although preferred embodiments of the present invention have been described above, the present invention can be carried out in yet other modes.

Figure 12:
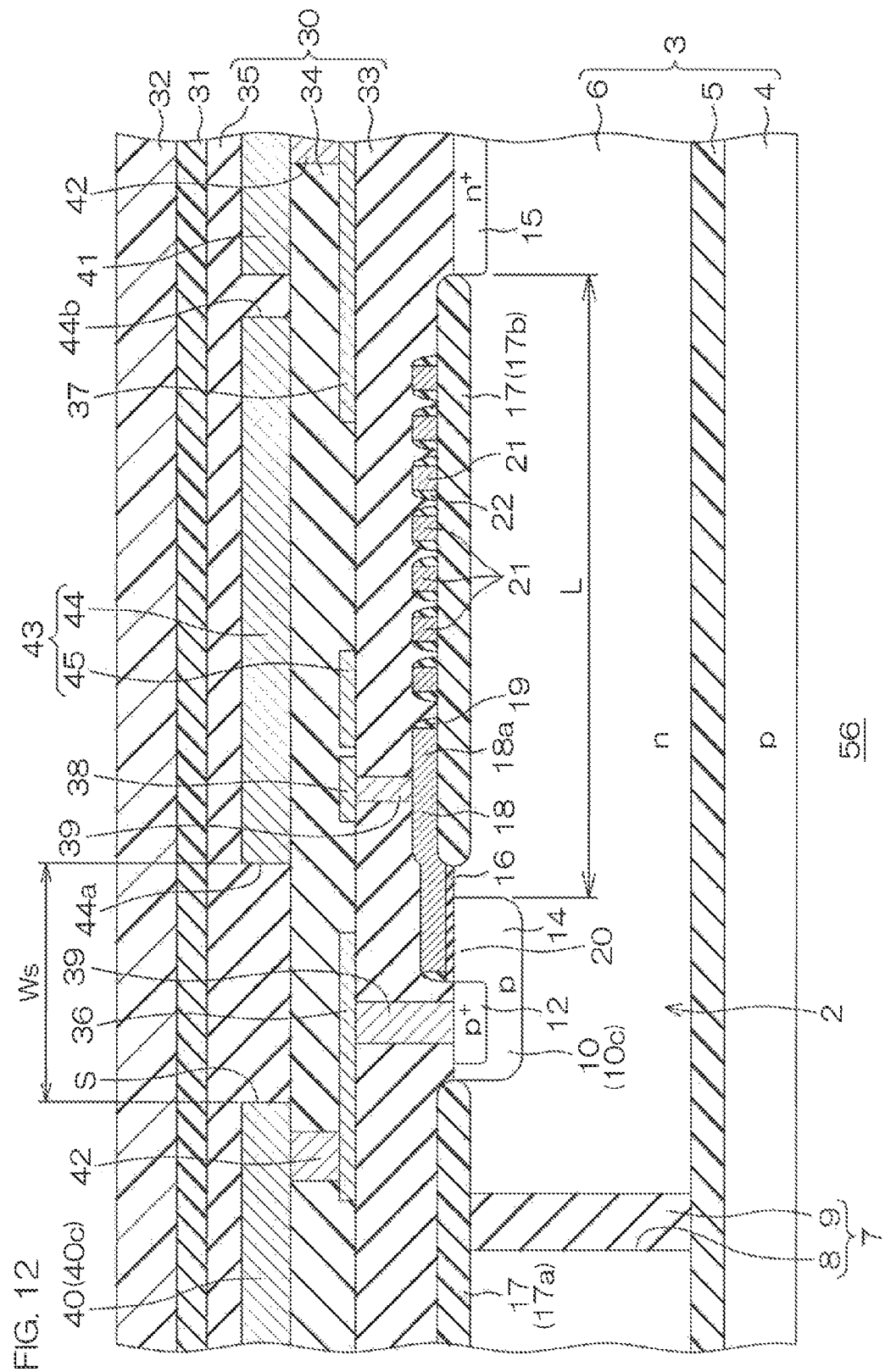
FIG. 12 is a sectional view showing a semiconductor device according to a first modification.

For example, in each preferred embodiment described above, a description has been given of an example in which the shielding member 43 includes the first conductive film 44 formed as a lead-out portion of the second drain electrode 41, but an arrangement shown in FIG. 12 may be employed. FIG. 12 is a sectional view showing a semiconductor device 56 according to a first modification. FIG. 12 is a sectional view corresponding to FIG. 4 in the description above. In FIG. 12, parts corresponding to the respective portions shown in FIG. 4 etc., are denoted by the same reference symbols, and description thereof will be omitted.

As shown in FIG. 12, in the semiconductor device 56, the first conductive film 44 of the shielding member 43 is formed on the second interlayer insulating film 34 apart from the second drain electrode 41 separately from the second drain electrode 41. The first conductive film 44 is formed so as to overlap the gate electrode 18 at least in part and collectively cover a region between the drain region 15 and the gate electrode 18. An end portion 44*b* closer to the second drain electrode 41 of the first conductive film 44 overlaps the first drain electrode 37 disposed in an underlayer in a plan view.

The end portion 44*b* closer to the second drain electrode 41 of the first conductive film 44 may overlap the drain region 15 in a plan view. To the first conductive film 44, a voltage higher than that of the second source electrode 40 may be applied, or a voltage the same as that of the second drain electrode 41 may be applied. The same effects as the effects described above for the preferred embodiment can be exhibited by such an arrangement as well. In addition, the arrangement shown in FIG. 12 can also be appropriately combined with the arrangement of each preferred embodiment described above.

Figure 13:
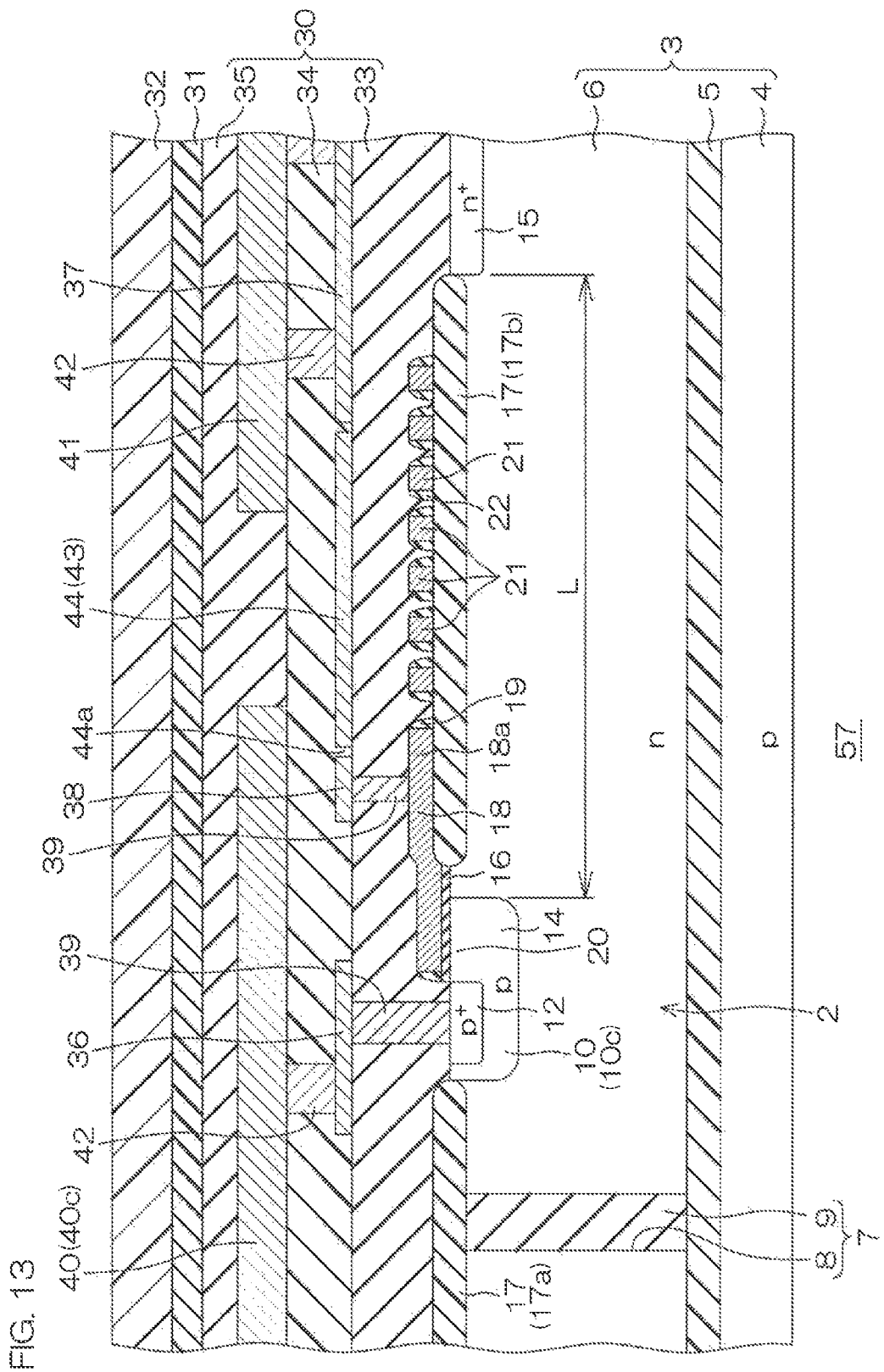
FIG. 13 is a sectional view showing a semiconductor device according to a second modification.

Also, in each preferred embodiment described above, a description has been given of an example in which the shielding member 43 includes the first conductive film 44 formed as a lead-out portion of the second drain electrode 41, but an arrangement shown in FIG. 13 may be employed. FIG. 13 is a sectional view showing a semiconductor device 57 according to a second modification. FIG. 13 is a sectional view corresponding to FIG. 4 in the description above. In FIG. 13, parts corresponding to the respective portions shown in FIG. 4 etc., are denoted by the same reference symbols, and description thereof will be omitted.

As shown in FIG. 13, in the semiconductor device 57, the first conductive film 44 of the shielding member 43 is made of an electrode film integrally formed in the same layer as with the first drain electrode 37, and is led out from the first drain electrode 37 so as to overlap the gate electrode 18. That is, the first conductive film 44 is formed on the first interlayer insulating film 33 as a first metal, and produces the same potential as that of the first drain electrode 37 (second drain electrode 41). The end portion 44*a* closer to the body region 10 of the first conductive layer 44 may overlap the second source electrode 40 in a plan view. The same effects as the effects described above for the preferred embodiment can be exhibited by such an arrangement as well. In addition, the arrangement shown in FIG. 13 can also be appropriately combined with the arrangement of each preferred embodiment described above.

Figure 14:
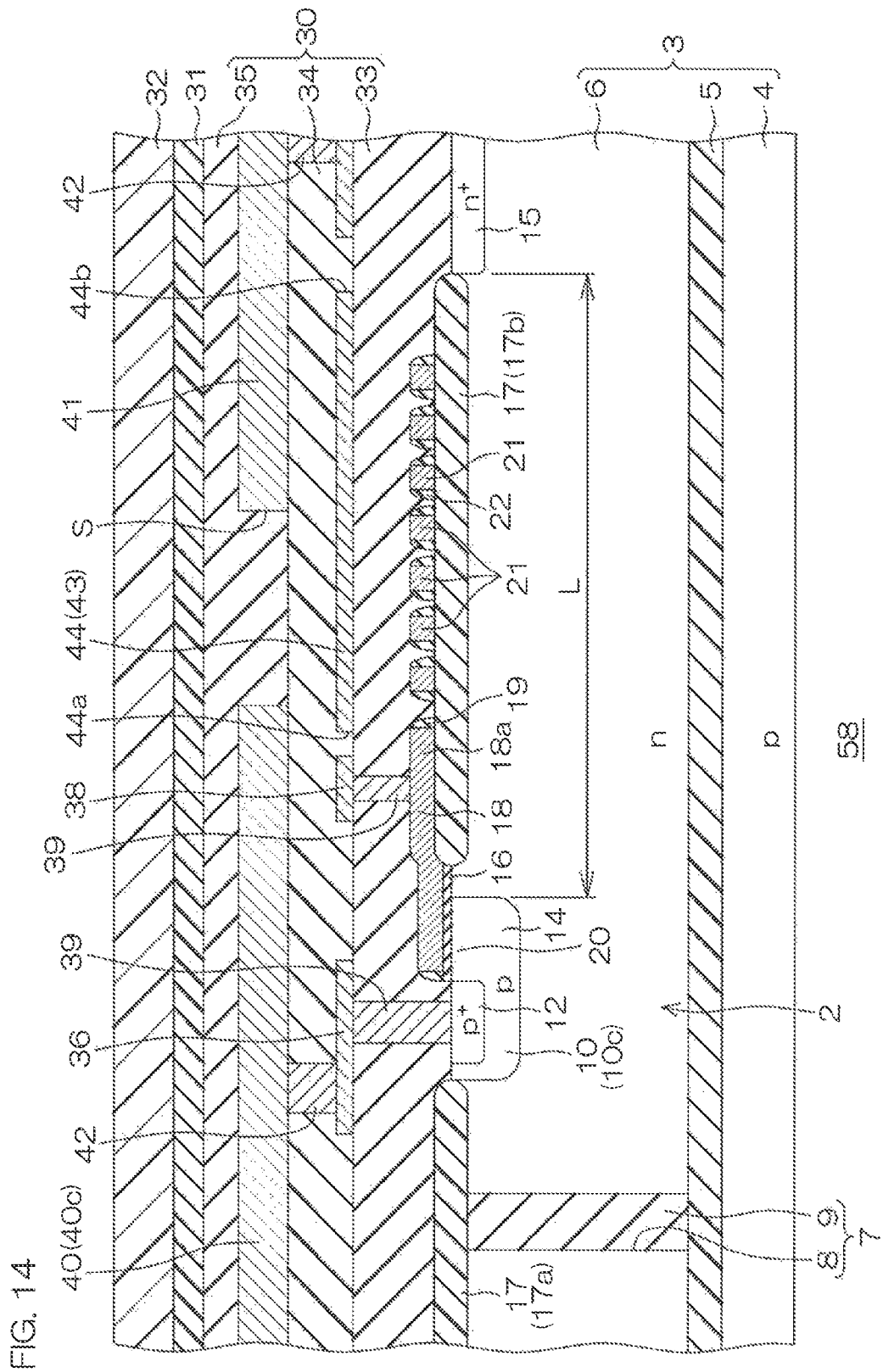
FIG. 14 is a sectional view showing a semiconductor device according to a third modification.

Further, the shielding member 43 may employ an arrangement shown in FIG. 14 in place of the arrangement shown in FIG. 13. FIG. 14 is a sectional view showing a semiconductor device 58 according to a third modification. FIG. 14 is a sectional view corresponding to FIG. 4 in the description above. In FIG. 14, parts corresponding to the respective portions shown in FIG. 4 etc., are denoted by the same reference symbols, and description thereof will be omitted.

As shown in FIG. 14, in the semiconductor device 58, the first conductive film 44 of the shielding member 43 is formed on the first interlayer insulating film 33 apart from the first drain electrode 37 separately from the first drain electrode 37. The first conductive film 44 is formed so as to overlap the gate electrode 18 at least in part and collectively cover a region between the drain region 15 and the gate electrode 18. Also, the first conductive film 44 is formed so as to overlap the second source electrode 40 and the second drain electrode 41 in a plan view.

The end portion 44*b* closer to the second drain electrode 41 of the first conductive film 44 may overlap the drain region 15 in a plan view. To the first conductive film 44, a voltage higher than that of the second source electrode 40 may be applied, or a voltage the same as that of the second drain electrode 41 may be applied. The same effects as the effects described above for the preferred embodiment can be exhibited by such an arrangement as well. In addition, the arrangement shown in FIG. 14 can also be appropriately combined with the arrangement of each preferred embodiment described above.

Also, in each preferred embodiment described above, a description has been given of an example in which the body region 10 in a substantially oval ring shape in a plan view having the straight parts 10a and 10b and the curved parts 10c and 10d is formed. But, the body region 10 may be in a substantially circular ring shape in a plan view. Moreover, the body contact region 12, the inner LOCOS film 17b, the gate electrode 18, etc., may also be formed in substantially circular ring shapes correspondingly to the body region 10. Alternatively, the body region 10 may be in a substantially polygonal ring shape in a plan view such as a triangular ring shape in a plan view, a quadrangular ring shape in a plan view, or a hexagonal ring shape in a plan view. Moreover, the body contact region 12, the inner LOCOS film 17b, the gate electrode 18, etc., may also be formed in substantially polygonal ring shapes in a plan view correspondingly to the body region 10.

When the body region 10 is formed in a substantially polygonal ring shape in a plan view, a distance L between the drain region 15 and a vertex portion of the body region 10 and a distance L between the drain region 15 and a side portion of the body region 10 are different. Therefore, a spot where the distance L is short serves as a bottleneck for withstand voltage, and the semiconductor device may consequently degrade in withstand voltage. It is therefore preferable that the body region 10 is formed in a substantially oval ring shape in a plan view or a substantially circular ring shape in a plan view with which the distance L between the drain region 15 and the body region 10 is uniform.

Alternatively, in place of the body region 10 in a substantially oval ring shape in a plan view or a substantially circular ring shape in a plan view, a body region 10 in a substantially linear shape in a plan view may be employed. Moreover, the body contact region 12, the inner LOCOS film 17b, the gate electrode 18, etc., may also be formed in substantially linear shapes in a plan view correspondingly to the body region 10.

Also, in each preferred embodiment described above, a description has been given of an example in which the plurality of source regions 11 are formed in a surface portion of the body region 10. But, a single source region 11 may be formed along the body region 10. That is, the source region 11 may be formed in a substantially oval ring shape in a plan view. In this case, the body region 10 does not have the breakdown voltage holding portion 14, and includes only the channel forming portion 13 that forms the channel 20 between the source region 11 and the epitaxial layer 6.

Also, in the preferred embodiment described above, a description has been given of an example in which the LOCOS film 17 is formed as an example of a thick insulating film. But, in place of the LOCOS film 17, STI (Shallow Trench Isolation) may be employed as an example of the thick insulating film. The STI includes an insulator embedded in a trench in a ring shape in a plan view formed by digging down the epitaxial layer 6 between the gate insulating film 16 and the drain region 15. The insulator may be formed, on the epitaxial layer 6, integrally with the gate insulating film 16. As the insulator, silicon oxide, silicon nitride, and the like can be exemplified. Insulating films formed by other element isolation techniques are suitable as the "thick insulating film."

Also, in each preferred embodiment described above, a description has been given of an example in which the single body region 10 formed continuously in a substantially oval ring shape in a plan view is included. But, the body region 10 may be formed intermittently in a manner divided into a plurality of parts. In this case, the body region 10 may be formed intermittently in a manner divided into a plurality of parts, along a band-shaped region along the outer peripheral edge of the inner LOCOS film 17b.

Also, in each preferred embodiment described above, a description has been given of an example in which the single body region 10 (single LDMIS) is formed in the single LDMIS region 2. But, a plurality of body regions 10 (a plurality of LDMISs) may be formed in the single LDMIS region 2.

Also, in each preferred embodiment described above, various semiconductor element regions and/or passive element regions such as CMIS (Complementary MIS) regions, BJT (Bipolar Junction Transistor) regions, JFET (Junction Field Effect Transistor) regions, capacitor regions, and resistance regions may be included in addition to the LDMIS region 2. Further, an integration circuit such as an LSI (Large Scale Integration), an SSI (Small Scale Integration), an MSI (Medium Scale Integration), a VLSI (Very Large Scale Integration), or an ULSI (Ultra-Very Large Scale Integration) may be constructed by a combination of the LDMIS region 2 with these semiconductor element regions and/or passive element regions.

Also, in each preferred embodiment described above, a description has been given of an example in which a voltage higher than the source voltage of the first and second source electrodes 36 and 40 is applied as a drain voltage to the first and second drain electrodes 37 and 41. But, to the first and second drain electrodes 37 and 41, a voltage lower than the source voltage of the first and second source electrodes 36 and 40 may be applied as a drain voltage.

Also, in each preferred embodiment described above, a description has been given of the semiconductor substrate 4 provided with a semiconductor type as p-type, but the conductivity type of the semiconductor substrate 4 may be inverted to be n-type. In this case, it suffices to invert the conductivity type of other regions according to the change in the conductivity type of the semiconductor substrate 4.

Figure 15:
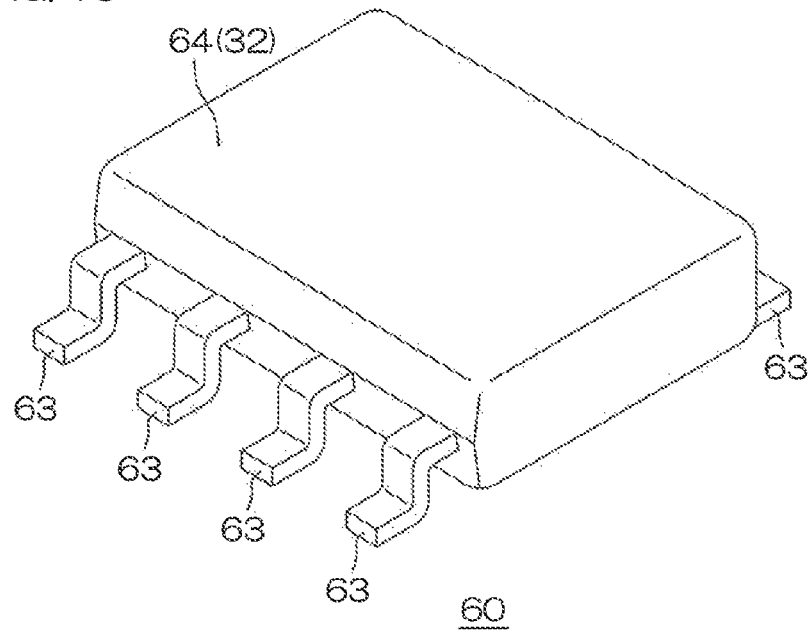
FIG. 15 is a perspective view showing an example of a semiconductor package.
Figure 16:
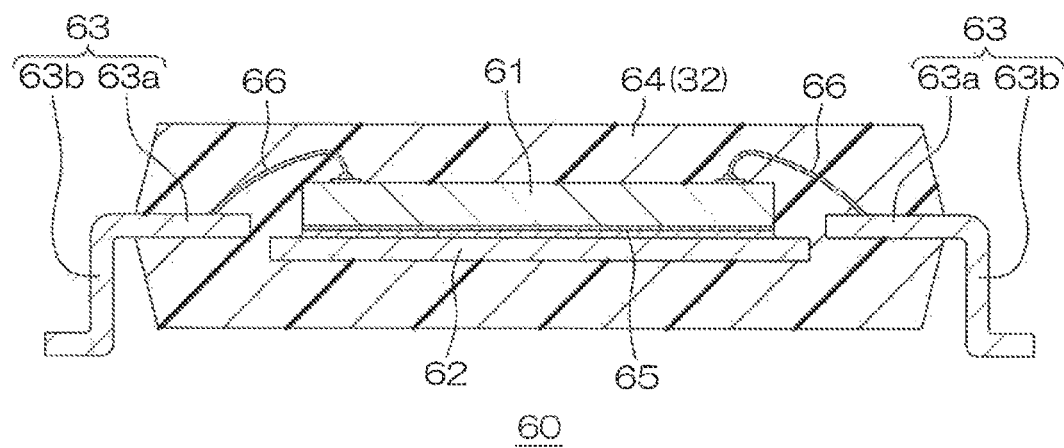
FIG. 16 is a sectional view of the semiconductor package shown in FIG. 15.

For the semiconductor devices 1 and 51 to 58, for example, a semiconductor package as shown in FIG. 15 and FIG. 16 may be employed. FIG. 15 is a perspective view showing an example of the semiconductor package 60. FIG. 16 is a sectional view of the semiconductor package 60 shown in FIG. 15. In the following, the semiconductor devices 1 and 51 to 58 are collectively called and simply referred to as a "semiconductor chip 61." In FIG. 15 and FIG. 16, an example with an SOP (Small Outline Package) type applied is shown as the semiconductor package 60.

As shown in FIG. 15 and FIG. 16, the semiconductor package 60 includes a die pad 62 on which the semiconductor chip 61 is placed, a plurality of leads 63 disposed around the die pad 62, and a molding resin 64 that seals these. The molding resin 64 includes in a part thereof the molding resin 32 described above. The semiconductor chip 61 is, for example, bonded on the die pad 62 via a paste 65 containing a metal or insulator.

The lead 63 includes an inner lead portion 63a sealed by the molding resin 64 and an outer lead portion 63b formed integrally with the inner lead portion 63a and led out of the molding resin 64. The inner lead portion 63a is, in the molding resin 64, electrically connected to the second source electrode 40, the second drain electrode 41, or the like of the semiconductor chip 61 corresponding thereto via a wiring member 66 such as a bonding wire. The outer lead portion 64b extends toward a lower surface of the molding resin 64, and forms a mounting terminal to be connected to a mounting substrate or the like.

Although a description has been given here of an example with an SOP type applied as a semiconductor package, a semiconductor package other than the SOP type is also suitable as one in which the semiconductor chip 61 is sealed as long as it includes the molding resin 62.

The semiconductor devices 1 and 51 to 58 can be incorporated in, for example, power modules for use in inverter circuits that drive electric motors available as power sources for automobiles (including electric vehicles), electric trains, industrial robots, air conditioners, air compressors, electric fans, vacuum cleaners, dryers, refrigerators, and the like. Additionally, the semiconductor devices 1 and 51 to 58 can also be incorporated in circuit modules that constitute analog control power sources, digital control power sources, and the like, besides also being able to be incorporated in power modules for use in inverter circuits of solar cells, wind power generators, other power generators, etc.

Various other design modifications can be made within the scope of the matters described in the claims.

What is claimed is:

1. A semiconductor device, comprising:
   a semiconductor layer of a first conductivity type;
   a body region of a second conductivity type formed in a surface portion of the semiconductor layer;
   a source region of a first conductivity type formed in a surface portion of the body region apart from a peripheral edge of the body region;
   a drain region of a first conductivity type formed in the surface portion of the semiconductor layer apart from the body region;
   a gate electrode opposed to the body region across a gate insulating film between the source region and the drain region;
   an insulating layer formed on the semiconductor layer;
   a resin formed on the insulating layer;
   a source electrode formed in the insulating layer so as to be electrically connected to the source region;
   a drain electrode formed in the insulating layer so as to be electrically connected to the drain region; and
   a conductive shielding member formed in the insulating layer so as to, in a plan view as viewed from a normal direction to a surface of the semiconductor layer, overlap the drain region and the gate electrode at least in part and cover a region between the drain region and the gate electrode, the conductive shielding member including a first conductive film that is electrically connected to the drain electrode and insulated from the source electrode.

2. The semiconductor device according to claim 1, wherein the first conductive film is made of an electrode film integrally formed in the same layer as with the drain electrode, and is led out from the drain electrode so as to overlap the gate electrode in the plan view.

3. The semiconductor device according to claim 1, wherein
   the shielding member further includes a second conductive film formed between the gate electrode and the first conductive film, for receiving a voltage lower than a voltage to be received by the drain electrode, and the first conductive film is made of an electrode film integrally formed in the same layer as with the drain electrode, and is led out from the drain electrode so as to overlap the gate electrode in the plan view.

4. The semiconductor device according to claim 1, wherein
   the first conductive film is made of an electrode film integrally formed in the same layer as with the drain electrode, is led out from the drain electrode toward the gate electrode, and has an end portion between the drain region and the gate electrode in the plan view, and
   the shielding member further includes a second conductive film that is formed between the gate electrode and the first conductive film so as to overlap the gate electrode and the first conductive film in the plan view, for receiving a voltage lower than a voltage to be received by the drain electrode.

5. The semiconductor device according to claim 1, wherein
   the first conductive film is made of an electrode film, for receiving a voltage higher than a voltage to be received by the source electrode, and formed so as to overlap the gate electrode at least in part in the plan view, and
   the shielding member further includes a second conductive film made of an electrode film, for receiving a voltage lower than a voltage to be received by the drain electrode, and formed so as to overlap the first conductive film and the gate electrode in the plan view.

6. The semiconductor device according to claim 1, wherein the shielding member is formed so as to cross the body region in the plan view.

7. The semiconductor device according to claim 1, wherein
   the body region has a channel forming portion that forms a channel between the semiconductor layer and the source region and a breakdown voltage holding portion in which the source region does not exist, and
   the shielding member is formed so as to cover at least a region between the drain region and the breakdown voltage holding portion of the body region in the plan view.

8. The semiconductor device according to claim 7, wherein the body region is formed in a ring shape in the plan view.

9. The semiconductor device according to claim 7, wherein
   the body region is formed in an oval ring shape having a pair of mutually parallel straight parts and a pair of curved parts that are respectively continuous to both ends of the pair of straight parts in the plan view,
   the channel forming portion of the body region is formed along at least one of the straight parts of the body region, and
   the breakdown voltage holding portion of the body region is formed along at least one of the curved parts of the body region.

10. The semiconductor device according to claim 1, further comprising a thick insulating film formed integrally with the gate insulating film so as to cover the semiconductor layer between the drain region and the gate insulating film, and having a thickness greater than that of the gate insulating film, wherein
    the gate electrode is formed continuously from on the gate insulating film to on the thick insulating film.

11. The semiconductor device according to claim 1, wherein the shielding member contains one or a plurality of types of metal selected from a group containing aluminum, copper, titanium, tungsten, and tantalum.

12. The semiconductor device according to claim 1, wherein a distance between the body region and the drain region is 50 μm or more and 200 μm or less.

13. The semiconductor device according to claim 1, wherein a drain-source voltage to be applied between the drain electrode and the source electrode is 400V or more and 1500V or less.

14. A semiconductor device comprising:
a semiconductor layer of a first conductivity type;
a body region of a second conductivity type formed in a surface portion of the semiconductor layer;
a source region of a first conductivity type formed in a surface portion of the body region apart from a peripheral edge of the body region;
a drain region of a first conductivity type formed in the surface portion of the semiconductor layer apart from the body region;
a gate electrode opposed to the body region across a gate insulating film between the source region and the drain region;
an insulating layer formed on the semiconductor layer;
a resin formed on the insulating layer;
a source electrode formed in the insulating layer so as to be electrically connected to the source region;
a drain electrode formed in the insulating layer so as to be electrically connected to the drain region; and
a conductive shielding member formed in the insulating layer so as to, in a plan view as viewed from a normal direction to a surface of the semiconductor layer, overlap the gate electrode at least in part and collectively cover a region between the drain region and the gate electrode, the conductive shielding member including a first conductive film that is electrically connected to the drain electrode and insulated from the source electrode.

15. A semiconductor device, comprising:
a semiconductor layer of a first conductivity type;
a source region and a drain region of a first conductivity type formed in a surface portion of the semiconductor layer apart from each other;
a body region of a second conductivity type formed in the surface portion of the semiconductor layer so as to enclose the source region, and having a channel forming portion that forms a channel between the semiconductor layer and the source region and a breakdown voltage holding portion in which the source region does not exist;
a gate electrode opposed to the body region across a gate insulating film between the source region and the drain region;
an insulating layer formed on the semiconductor layer;
a resin formed on the insulating layer; and
a conductive shielding member formed in the insulating layer so as to, in a plan view as viewed from a normal direction to a surface of the semiconductor layer, cover at least a region between the drain region and the breakdown voltage holding portion of the body region, the conductive shielding member including a first conductive film that is electrically connected to the drain region and insulated from the source region.

* * * * *